(12) United States Patent
Choi

(10) Patent No.: US 12,713,745 B2
(45) Date of Patent: Aug. 18, 2026

(54) DISPLAY DEVICE AND METHOD OF FABRICATING THE SAME

(71) Applicant: Samsung Display Co., LTD., Yongin-si (KR)

(72) Inventor: Ji Woong Choi, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 900 days.

(21) Appl. No.: 17/980,902

(22) Filed: Nov. 4, 2022

(65) Prior Publication Data

US 2023/0275199 A1 Aug. 31, 2023

(30) Foreign Application Priority Data

Feb. 25, 2022 (KR) ........................ 10-2022-0025156

(51) Int. Cl.

*H10H 20/857* (2025.01)
*H10H 20/01* (2025.01)
*H10H 20/831* (2025.01)
*H10W 90/00* (2026.01)

(52) U.S. Cl.

CPC .......... *H10H 20/857* (2025.01); *H10H 20/01* (2025.01); *H10H 20/8312* (2025.01); *H10W 90/00* (2026.01); *H10H 20/032* (2025.01); *H10H 20/0364* (2025.01)

(58) Field of Classification Search

CPC .............. G02F 1/13458; H10H 20/032; H10H 20/0364; H10H 20/857; H01L 24/05; H01L 24/24; H01L 25/0753; H01L 25/167

See application file for complete search history.

(56) References Cited

U.S. PATENT DOCUMENTS 6,266,120 B1 * 7/2001 Han ........................ H05K 3/363 349/149
2012/0168790 A1 * 7/2012 Tseng .................. H01L 23/5328 977/773
2012/0193656 A1 * 8/2012 Tseng .................. H10K 59/123 257/E33.012
2018/0270950 A1 * 9/2018 Park ....................... H05K 1/113
2019/0081267 A1 * 3/2019 Lee ......................... H01L 24/09

FOREIGN PATENT DOCUMENTS

KR 1999-018956 3/1999

* cited by examiner

*Primary Examiner* — Eric A. Ward
(74) *Attorney, Agent, or Firm* — Lerner David LLP

(57) ABSTRACT

A display device may include a wiring pad and a dummy pad disposed on a substrate and spaced apart from each other, a planarization layer disposed over the wiring pad and the dummy pad, a first insulating layer disposed on the planarization layer, the first insulating layer exposing a portion of the planarization layer, a first pad electrode and a second pad electrode disposed on the planarization layer and the first insulating layer, the first pad electrode electrically connected to the wiring pad and the second pad electrode electrically connected to the dummy pad, a second insulating layer disposed on the first pad electrode and the second pad electrode, conductive particles disposed on the first pad electrode and the second pad electrode, the conductive particles having a cylindrical shape, and an external device disposed on the conductive particles.

14 Claims, 29 Drawing Sheets

GRO: GRO1, GRO2

DISPLAY DEVICE AND METHOD OF FABRICATING THE SAME

CROSS-REFERENCE TO RELATED APPLICATION(S)

This application claims priority to and benefits of Korean Patent Application No. 10-2022-0025156 under 35 U.S.C. § 119 filed on Feb. 25, 2022, in the Korean Intellectual Property Office, the entire contents of which are incorporated herein by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices include a display panel such as an organic light-emitting display panel and a liquid-crystal display panel for displaying images. Among them, a light-emitting display panel may include light-emitting elements. For example, light-emitting diodes (LEDs) may include an organic light-emitting diode (OLED) using an organic material as a luminescent material, and an inorganic light-emitting diode using an inorganic material as a luminescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including a novel pad electrode structure.

Aspects of the disclosure also provide a method of fabricating a display device employing the novel pad electrode structure to align conductive particles.

It should be noted that objects of the disclosure are not limited to the above-mentioned objects; and other objects of the disclosure will be apparent to those skilled in the art from the following descriptions.

According to an embodiment, a display device may include a wiring pad and a dummy pad disposed on a substrate and spaced apart from each other; a planarization layer disposed over the wiring pad and the dummy pad; a first insulating layer disposed on the planarization layer, the first insulating layer exposing a portion of the planarization layer; a first pad electrode and a second pad electrode disposed on the planarization layer and the first insulating layer, the first pad electrode electrically connected to the wiring pad and the second pad electrode electrically connected to the dummy pad; a second insulating layer disposed on the first pad electrode and the second pad electrode; conductive particles disposed on the first pad electrode and the second pad electrode, the conductive particles having a cylindrical shape; and an external device disposed on the conductive particles.

In an embodiment, each of the conductive particles may include a conductive layer; and a capping layer surrounding the conductive layer, and the conductive layer may have a cylindrical shape.

In an embodiment, a side surface of the cylindrical shape of each of the conductive particles may electrically contact the first pad electrode and the second pad electrode.

In an embodiment, the external device may include circuit lines disposed on a surface, and the circuit lines may electrically contact the conductive particles.

In an embodiment, the display device may further include a non-conductive layer disposed between the external device and the substrate, wherein the conductive particles may be dispersed in the non-conductive layer.

In an embodiment, the planarization layer may include a first through hole exposing the wiring pad and a second through hole exposing the dummy pad, the first pad electrode may electrically contact the wiring pad through the first through hole, and the second pad electrode may electrically contact the dummy pad through the second through hole of the planarization layer.

In an embodiment, the first insulating layer may include a first opening exposing the first through hole and the second through hole of the planarization layer.

In an embodiment, the second insulating layer may include a second opening exposing the first pad electrode and the second pad electrode, and the conductive particles may electrically contact the first pad electrode and the second pad electrode through the second opening of the second insulating layer.

In an embodiment, the wiring pad and the dummy pad may be spaced apart from each other in a first direction, extended in a second direction intersecting the first direction, and disposed on a same layer.

In an embodiment, a width of the wiring pad in the first direction may be greater than a width of the dummy pad in the first direction.

In an embodiment, the first pad electrode may include first grooves formed in an upper surface, the second pad electrode may include second grooves formed in an upper surface, and the first grooves and the second grooves may face each other.

In an embodiment, the first grooves may be opened toward the second grooves, and the second grooves may be opened toward the first grooves.

In an embodiment, portions of first ends of the conductive particles may be disposed in the first grooves, and portions of second ends of the conductive particles may be disposed in the second grooves.

In an embodiment, a depth of each of the first grooves and the second grooves may be smaller than a diameter of the conductive particles.

In an embodiment, the display device may further include light-emitting elements disposed on the first insulating layer, the light emitting elements and the first insulating layer being spaced apart from the wiring pad and the dummy pad; and a first connection electrode may electrically contact first ends of the light-emitting elements and a second connection electrode may electrically contact second ends of the light-emitting elements, wherein the first pad electrode and the second pad electrode, the first connection electrode, and the second connection electrode may include a same material.

According to an embodiment, a method of fabricating a display device may include forming a wiring pad and a dummy pad spaced apart from each other on a substrate; forming a planarization layer over the wiring pad and the dummy pad; forming a first insulating layer exposing a portion of the planarization layer on the planarization layer; forming a first pad electrode and a second pad electrode spaced apart from each other on the planarization layer and the first insulating layer; preparing a conductive ink containing a solvent and conductive particles dispersed in the solvent; ejecting the conductive ink onto the first pad electrode and the second pad electrode; disposing the conductive particles between the first pad electrode and the second pad electrode by generating an electric field between the first pad electrode and the second pad electrode; aligning an external device comprising circuit lines on the substrate and forming a non-conductive layer covering the circuit lines; and bonding the external device with the substrate.

In an embodiment, the electric field may be generated by applying an alternating current electrical signal to the first pad electrode and the second pad electrode.

In an embodiment, the bonding of the external device with the substrate may include aligning the circuit lines of the external device with the first pad electrode and the second pad electrode of the substrate; and bonding the external device with the substrate by applying heat and pressure from above the external device.

In an embodiment, the conductive particles may electrically connect the circuit lines to the first pad electrode and the circuit lines to the second pad electrode by the applying of the pressure.

In an embodiment, the method may further include performing heat treatment to remove the solvent after the disposing of the conductive particles.

According to embodiments, conductive particles are aligned on pad electrodes using a dielectrophoresis method, so that it is possible to prevent a short-circuit from being created due to agglomeration of the conductive particles and to prevent failure of the device.

According to an embodiment, conductive particles have a cylindrical shape, so that the surface contact between an external device and pad electrodes can be readily achieved in a low-pressure bonding process, and the contact resistance can be lowered, allowing electrical signals to be readily transmitted.

According to an embodiment, by forming grooves in the pad electrodes, the space in which the conductive particles can be disposed is provided, so that it is possible to prevent agglomeration of the conductive particles.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
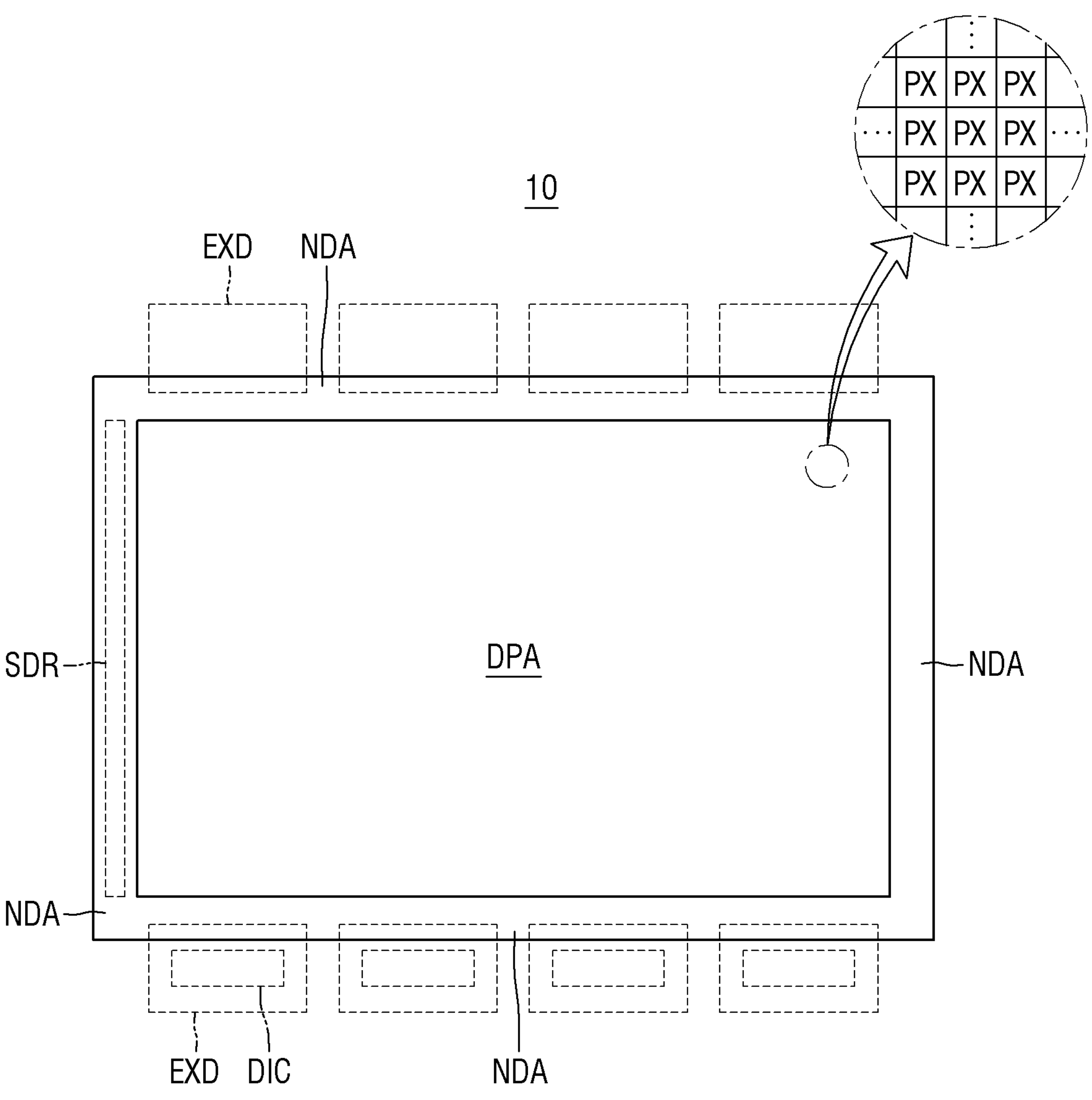
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments of the disclosure may be combined with each other, in part or in whole, and other embodiments are possible. Each embodiment may be implemented independently of each other or may be implemented together.

Hereinafter, embodiments will be described with reference to the accompanying drawings.

FIG. 1 is a schematic plan view of a display device according to an embodiment.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc., within the spirit and the scope of the disclosure.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc., within the spirit and the scope of the disclosure. In the following description, an inorganic light-emitting diode display panel is employed as an example of the display panel 10, but the disclosure is not limited thereto. Any other display panel may be employed within the scope of the disclosure.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc., within the spirit and the scope of the disclosure. The shape of a display area DPA of the display device 10 may also be similar to the overall shape of the display device 10. FIG. 1 shows the display device 10 in the shape of a rectangle with longer horizontal sides and the display area DPA.

The display device 10 may include a display area DPA and a non-display area NDA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged or disposed in a matrix. The shape of each pixel PX may be, but is not limited to, a rectangle or a square in case that viewed from the top. Each pixel may have a diamond shape having sides inclined with respect to a direction. The pixels PX may be arranged or disposed in stripes or the PENTILE™ pattern alternately. Each of the pixels PX may include at least one light-emitting element 30 that emits light of a particular wavelength band to represent a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10.

In the non-display areas NDA, a driving circuit or a driving element for driving the display area DPA may be disposed. According to an embodiment, pad areas may be disposed on the display substrate of the display device 10 in a non-display area NDA disposed adjacent to a first longer side (the lower side in FIG. 10) of the display device 10 and a non-display area NDA adjacent to a second longer side (the upper side in FIG. 1) of the display device 10. An external device EXD may be mounted on pad electrodes of the pad areas. Examples of the external device EXD may include a connection film, a printed circuit board, a driver chip DIC, a connector, a line connection film, etc., within the spirit and the scope of the disclosure. A scan driver SDR formed on or directly on the display substrate of the display device 10 or the like may be disposed in the non-display area NDA disposed adjacent to a first shorter side of the display device 10 (the left side in FIG. 1).

Figure 2:
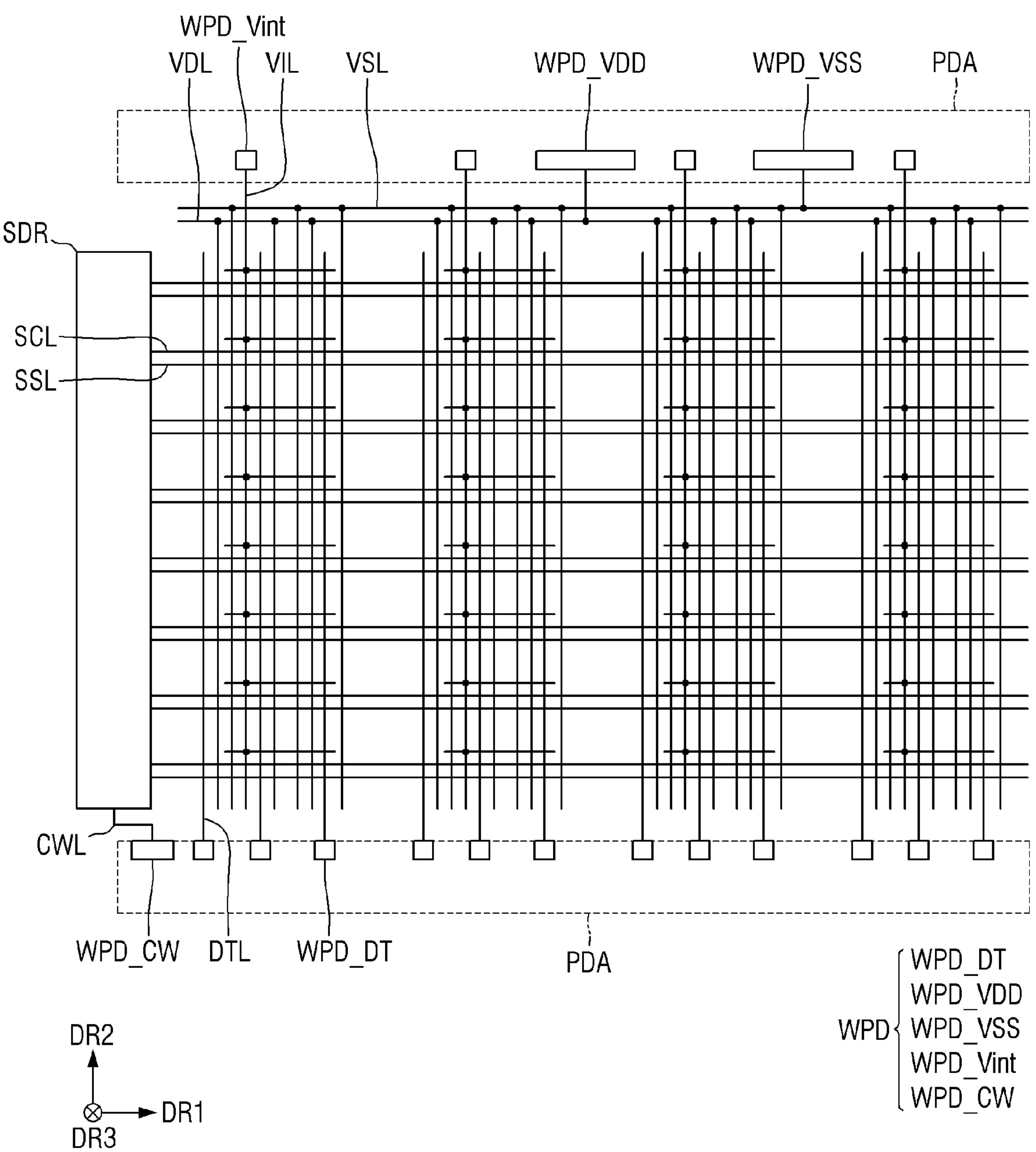
FIG. 2 is a plan diagram schematically showing lines included in a display device according to an embodiment.

FIG. 2 is a plan diagram schematically showing lines included in a display device according to an embodiment.

Referring to FIG. 2, the display device 10 may include lines. The lines may include a scan line SCL, a sensing line SSL, a data line DTL, an initialization voltage line VIL, a first voltage line VDL, a second voltage line VSL, etc., within the spirit and the scope of the disclosure. Also, although not shown in the drawings, other lines may be further disposed in the display device 10.

The scan line SCL and the sensing line SSL may be extended in the first direction DR1. The scan line SCL and the sensing line SSL may be connected to a scan driver SDR. The scan driver SDR may include a driving circuit. The scan driver SDR may be disposed on, but is not limited to, one side or a side of the display area DPA in the first direction DR1. The scan driver SDR may be connected to a signal connection line CWL, and at least one end or an end of the signal connection line CWL may form a pad WPD_CW on the non-display area NDA to be connected to an external device.

As used herein, when an element is referred to as being "connected" or "coupled" to another element, it can be directly connected or coupled to the element or intervening elements may be present. Such elements may be understood as a single integrated element and thus a portion thereof may be connected to another portion. Moreover, when an element is referred to as being "connected" to another element, it may be in direct contact with the element and also electrically connected to the element. Connection may also imply a physical connection.

The data line DTL and the initialization voltage line VIL may be extended in a second direction DR2 crossing or intersecting the first direction DR1. The initialization voltage line VIL may further include branches as well as the portion extended in the second direction DR2. Each of the first voltage line VDL and the second voltage line VSL may also include portions extended in the second direction DR2 and portions connected thereto and extended in the first direction DR1. The first voltage line VDL and the second voltage line VSL may have, but is not limited to, a mesh structure. Although not shown in the drawings, each of the pixels PX of the display device 10 may be connected to at least one data line DTL, the initialization voltage line VIL, the first voltage line VDL, and the second voltage line VSL.

The data line DTL, the initialization voltage line VIL, the first voltage line VDL and the second voltage line VSL may be electrically connected to one or more wiring pads WPD. The wiring pads WPD may be disposed in the non-display areas NDA. According to an embodiment, a wiring pad WPD_DT of the data line DTL (hereinafter referred to as a data pad) may be disposed in a pad area PDA on one side or a side of the display area DPA in the second direction DR2, and a wiring pad WPD_Vint of the initialization voltage line VIL (hereinafter referred to as an initialization voltage pad), a wiring pad WPD_VDD of the first voltage line VDL (hereinafter referred to as a first power pad), and a wiring pad WPD_VSS of the second voltage line VSL (hereinafter referred to as a power pad) may be disposed in the pad area PDA located or disposed on the other side of the display area DPA in the second direction DR2. As another example, the data pad WPD_DT, the initialization voltage pad WPD_Vint and the first supply voltage pad WPD_VDD and the second supply voltage pad WPD_VSS may all be disposed in a same area, for example, in the non-display area NDA on the upper side of the display area DPA. The external device EXD may be mounted on the wiring pads WPD. The external device EXD may be mounted on the wiring pads WPD by an anisotropic conductive film, ultrasonic bonding, etc., within the spirit and the scope of the disclosure.

Each of the pixels PX, or sub-pixels SPXn, for example, SPX1, SPX2, SPX3, of the display device 10 may include a pixel driving circuit, where n is an integer of 1 to 3. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to an embodiment, each of the sub-pixels SPXn of the display device 10 may have a 3T1C structure, for example, a pixel driving circuit may include three transistors and one capacitor. In the following description, the pixel driving circuit having the 3T1C structure will be described as an example. It is, however, to be understood that the disclosure is not limited thereto. A variety of modified pixel structure may be employed such as a 2T1C structure, a 7T1C structure and a 6T1C structure.

Figure 3:
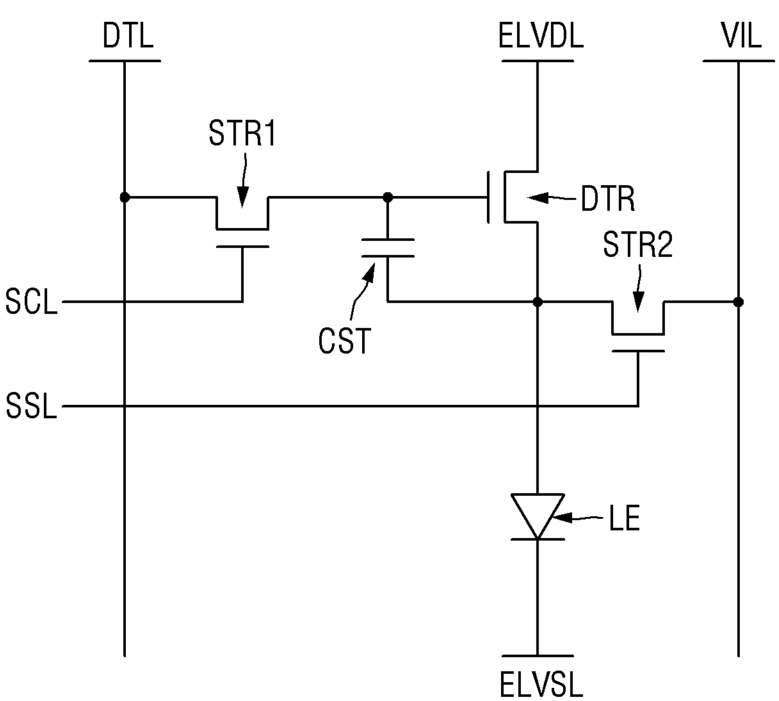
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, each of the sub-pixels SPXn of the display device 10 according to an embodiment may include three transistors DTR, STR1 and STR2 and one storage capacitor CST in addition to a light-emitting element LE.

The light-emitting element LE emits light in proportional to the current supplied through the driving transistor DTR. The light-emitting element LE may be implemented as an inorganic light-emitting diode, an organic light-emitting diode, a micro light-emitting diode, a nano light-emitting diode, etc., within the spirit and the scope of the disclosure.

The first electrode (for example, the anode electrode) of the light-emitting element LE may be connected to the source electrode of the driving transistor DTR, and the second electrode (for example, the cathode electrode) thereof may be connected to a second supply voltage line ELVSL, from which a low-level voltage (second supply voltage) is applied, lower than a high-level voltage (first supply voltage) of a first supply voltage line ELVDL.

The driving transistor DTR adjusts a current flowing from the first supply voltage line ELVDL from which the first supply voltage is applied to the light-emitting element LE according to the voltage difference between a gate electrode and a source electrode. The gate electrode of the driving transistor DTR may be connected to a first electrode of the first transistor STR1, the source electrode may be connected to a first electrode of the light-emitting element LE, and the drain electrode may be connected to the first supply voltage line ELVDL from which the first supply voltage is applied.

The first transistor STR1 is turned on by a scan signal of a scan line SCL to connect a data line DTL with the gate electrode of the driving transistor DTR. A gate electrode of the first transistor STR1 may be connected to the scan line SCL, the first electrode thereof may be connected to the gate electrode of the driving transistor DTR, and a second electrode thereof may be connected to the data line DTL.

The second transistor STR2 may be turned on by a sensing signal of a sensing signal line SSL to connect the initialization voltage line VIL to the source electrode of the driving transistor DTR. A gate electrode of the second transistor STR2 may be connected to the sensing signal line SSL, a first electrode thereof may be connected to the initialization voltage line VIL, and a second electrode thereof may be connected to the source electrode of the driving transistor DTR.

According to an embodiment, the first electrode of each of the first and second transistors STR1 and STR2 may be a source electrode while the second electrode thereof may be a drain electrode. It is, however, to be understood that the disclosure is not limited thereto. The first electrode of each of the first and second switching transistors STR1 and STR2 may be a drain electrode while the second electrode thereof may be a source electrode.

The capacitor CST may be formed between the gate electrode and the source electrode of the driving transistor DTR. The storage capacitor CST stores a voltage difference between the gate voltage and the source voltage of the driving transistor DTR.

The driving transistor DTR and the first and second transistors STR1 and STR2 may be formed as thin-film transistors. Although FIG. 3 shows that each of the driving transistor DTR and the first and second switching transistors STR1 and STR2 is implemented as an n-type MOSFET (metal oxide semiconductor field effect transistor), it is to be noted that the disclosure is not limited thereto. For example, the driving transistor DTR and the first and second switching transistors STR1 and STR2 may be implemented as p-type MOSFETs, or some of them may be implemented as n-type MOSFETs while the others may be implemented as p-type MOSFETs.

Figure 4:
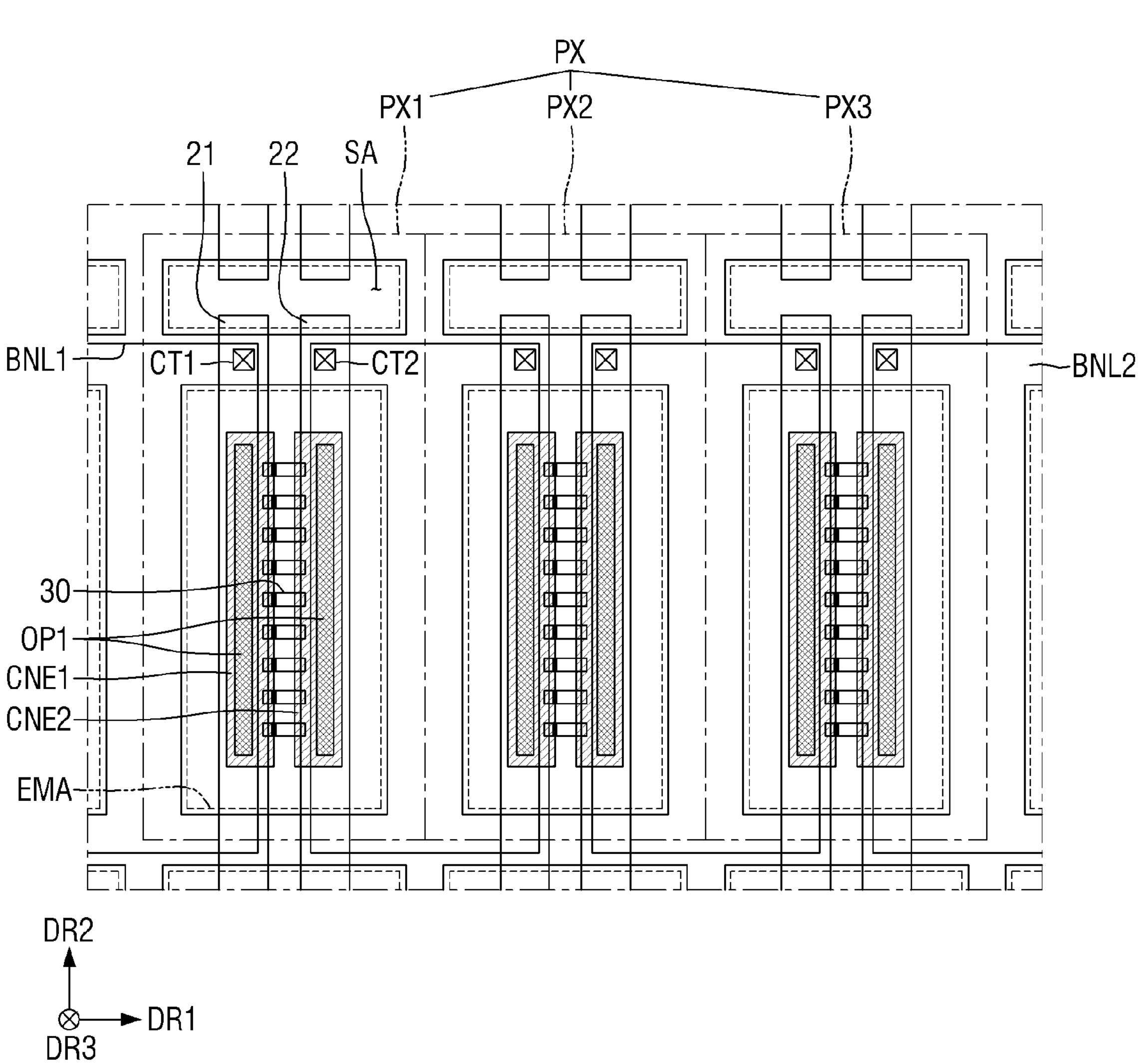
FIG. 4 is a schematic plan view showing a pixel of a display device according to an embodiment.

FIG. 4 is a schematic plan view showing a pixel of a display device according to an embodiment.

Referring to FIG. 4, each of the pixels PX may include sub-pixels SPXn, where n is an integer from one to three. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the disclosure is not limited thereto. All the sub-pixels SPXn may emit light of a same color. Although the pixel PX may include three sub-pixels SPXn in the example shown in FIG. 4, the disclosure is not limited thereto. The pixel PX may include more than three sub-pixels PXn.

Each of the sub-pixels SPXn of the display device 10 may include an emission area EMA and a non-emission area (not shown). In the emission area EMA, the light-emitting elements 30 may be disposed to emit light of a particular wavelength. In the non-emission area, no light-emitting element 30 is disposed and light emitted from the light-emitting elements 30 do not reach and thud no light exits therefrom. The emission area may include an area in which the light-emitting elements 30 are disposed, and may include an area adjacent to the light-emitting elements 30 where lights emitted from the light-emitting element 30 exit.

It is, however, to be understood that the disclosure is not limited thereto. The emission area may also include an area in which light emitted from the light-emitting elements 30 is reflected or refracted by other elements to exit. The light-emitting elements 30 may be disposed in each of the sub-pixels SPXn, and the emission area may include the area where the light-emitting elements are disposed and the adjacent area.

Each of the sub-pixels SPXn may include a subsidiary area SA disposed in the non-emission area. The subsidiary area SA may be disposed on one side or a side of the emission area EMA in the second direction DR2. The subsidiary area SA may be disposed between the emission areas EMA of neighboring sub-pixels SPXn in the second direction DR2. In the display area DPA of the display device 10, emission areas EMA and subsidiary areas SA may be arranged or disposed. For example, the emission areas EMA and the subsidiary areas SA may be arranged or disposed repeatedly in the first direction DR1, and may be arranged or disposed alternately in the second direction DR2. The spacing between the subsidiary areas SA in the first direction DR1 may be smaller than the spacing between the emission areas EMA in the first direction DR1. A bank BNL may be disposed between the subsidiary areas SA and the emission areas EMA, and the distance between them may vary depending on the width of the bank BNL. Although the light-emitting elements 30 are not disposed in the subsidiary areas SA and thus no light exits therefrom, portions of the electrodes 21 and 22 disposed in each of the sub-pixels SPXn may be disposed there. The electrodes 21 and 22 disposed in a sub-pixel SPXn may be separated from those in another sub-pixel SPXn in the subsidiary area SA.

Figure 5:
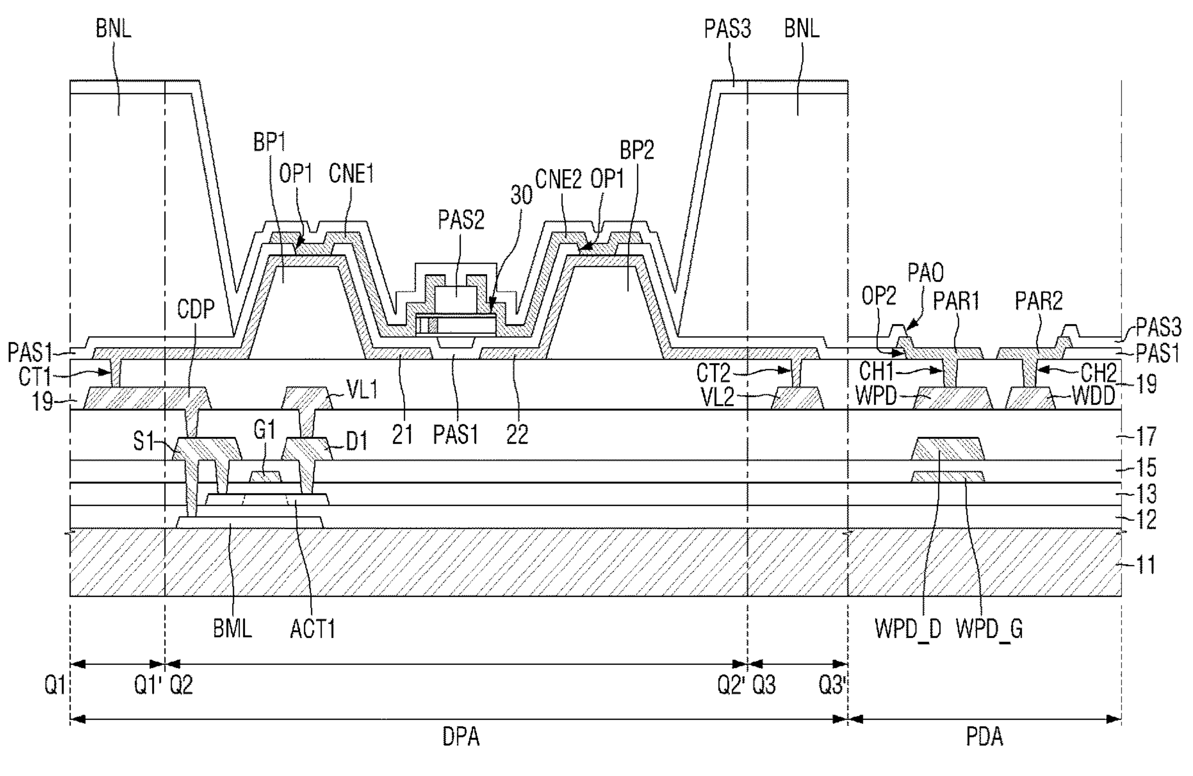
FIG. 5 is a schematic cross-sectional view of a display area and a pad area of a display device according to an embodiment .
Figure 6:
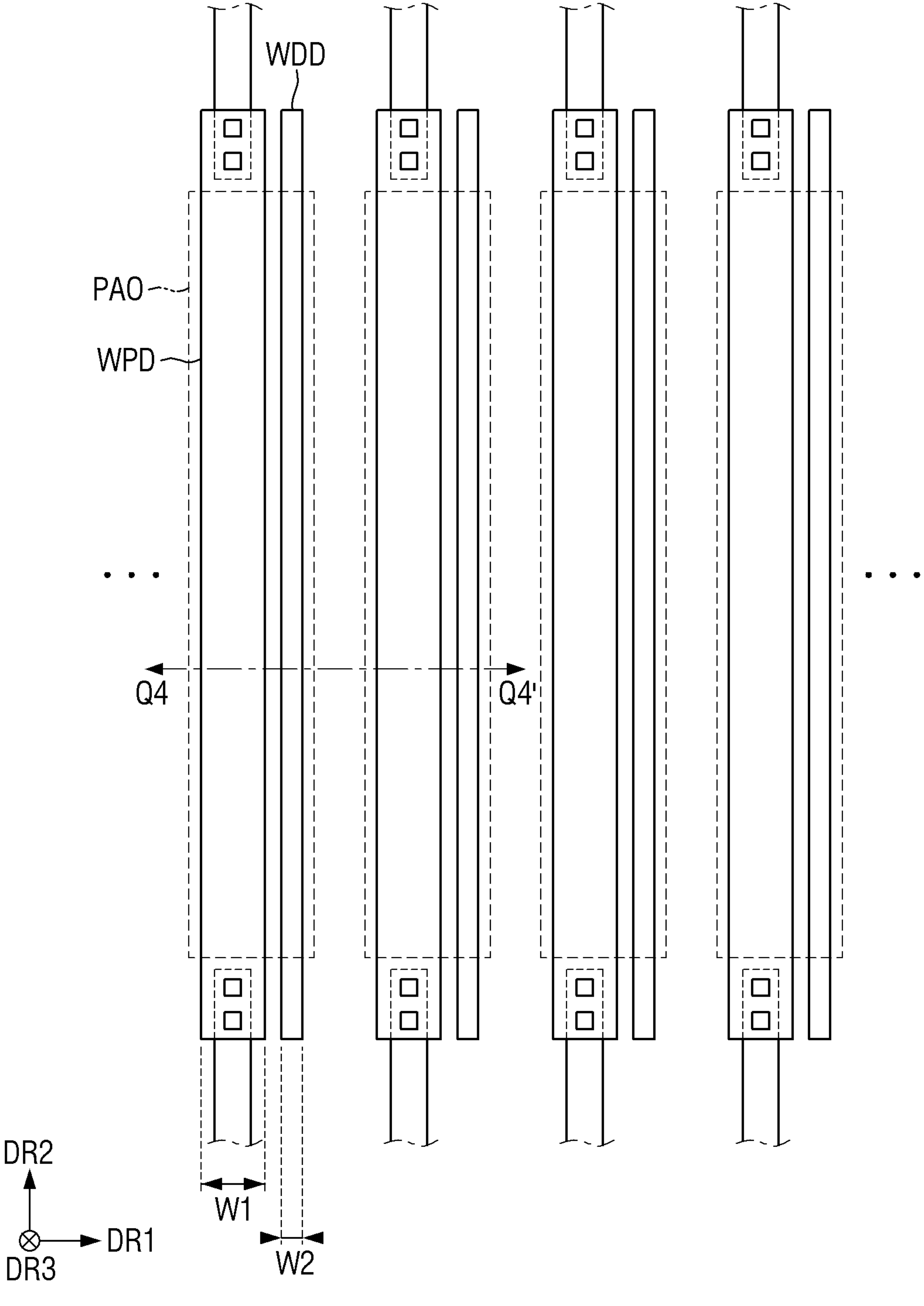
FIG. 6 is a schematic plan view of the pad area of the display device according to an embodiment.
Figure 7:
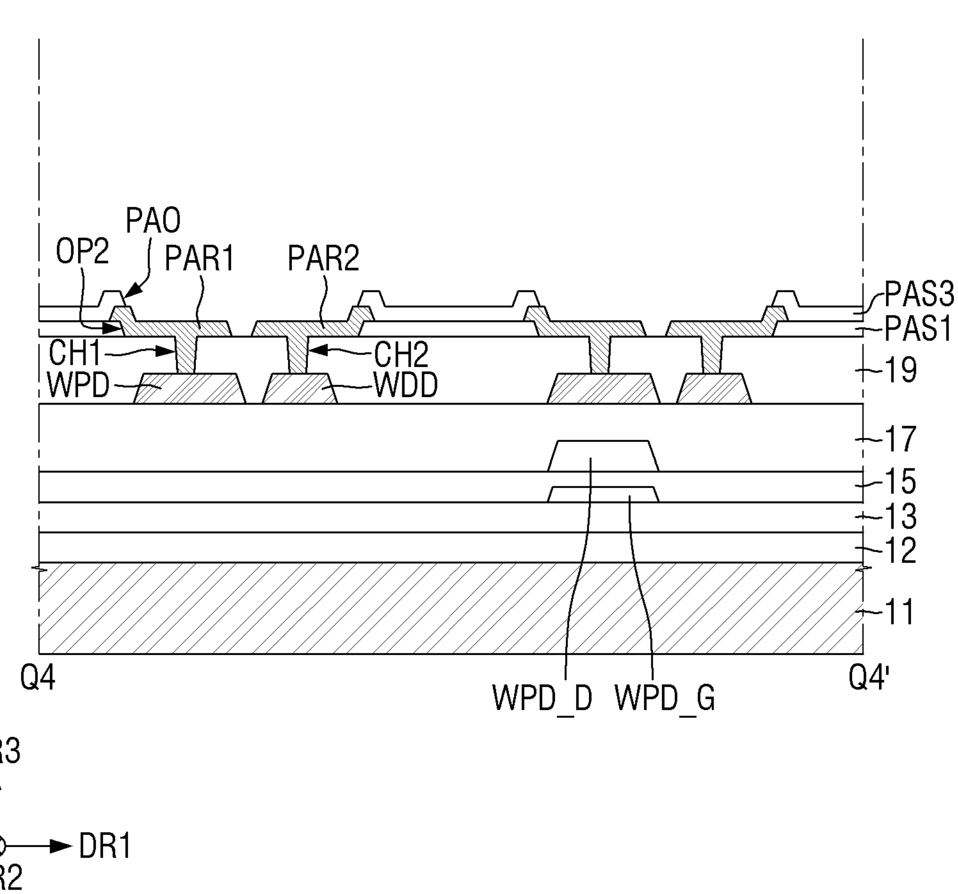
FIG. 7 is a schematic cross-sectional view taken along line Q4-Q4' of FIG. 6.
Figure 8:
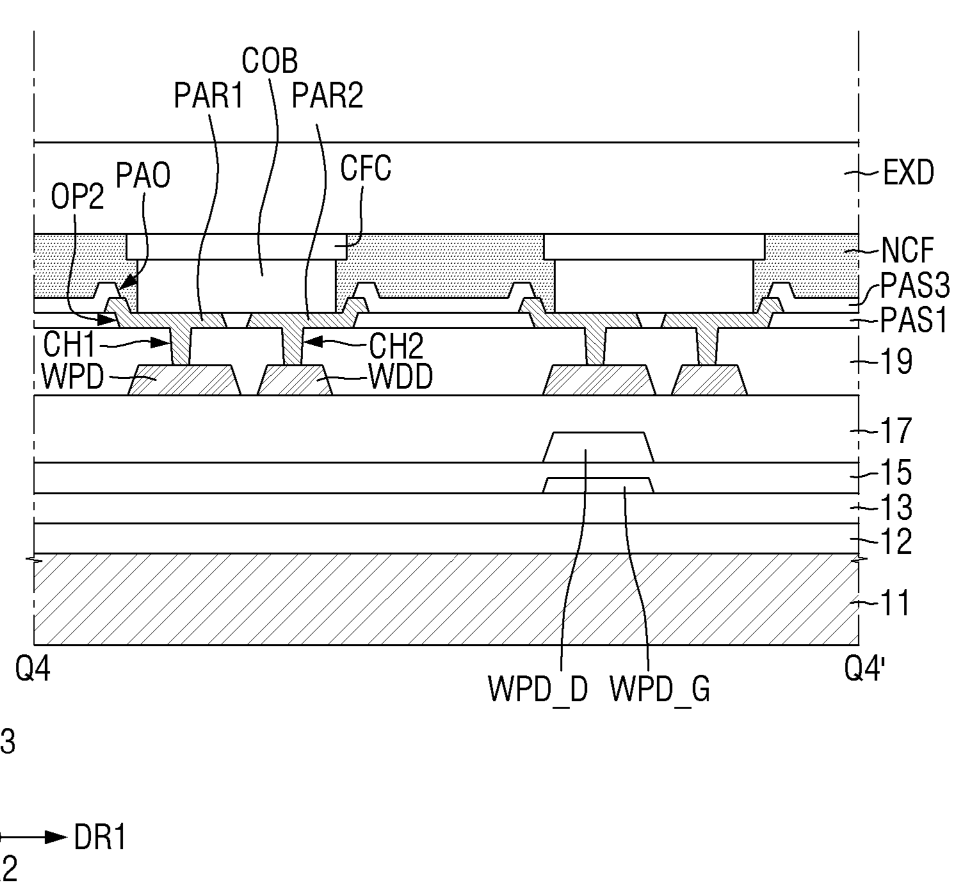
FIG. 8 is a schematic cross-sectional view schematically showing the pad area of the display device according to an embodiment.
Figure 9:
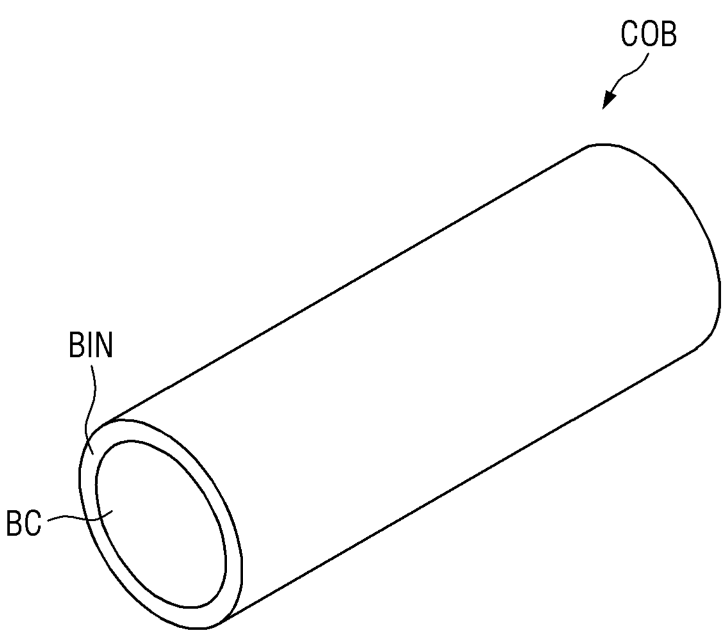
FIG. 9 is a schematic perspective view schematically showing a conductive particle of the display device according to an embodiment.
Figure 10:
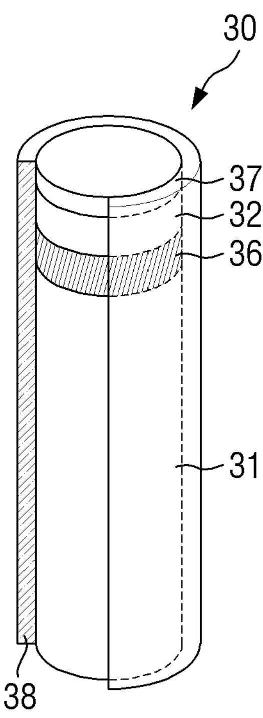
FIG. 10 is a schematic perspective view schematically showing a light-emitting element according to an embodiment.

FIG. 5 is a schematic cross-sectional view of a display area and a pad area of a display device according to an embodiment. FIG. 6 is a schematic plan view of the pad area of the display device according to an embodiment. FIG. 7 is a schematic cross-sectional view taken along line Q4-Q4' of FIG. 6. FIG. 8 is a schematic cross-sectional view schematically showing the pad area of the display device according to an embodiment. FIG. 9 is a schematic perspective view schematically showing a conductive particle of the display device according to an embodiment. FIG. 10 is a schematic perspective view schematically showing a light-emitting element according to an embodiment.

The schematic cross-sectional view of FIG. 5 shows arrangements of electrodes 21 and 22, light-emitting elements 30 and connection electrodes CNE1 and CNE2 disposed in the emission area EMA along with pad electrodes in the pad area PDA in a sub-pixel SPXn of the display area DPA. Although only one first transistor T1 is shown in FIG. 5, the disclosure is not limited thereto. Three transistors T1, T2 and T3 and one storage capacitor CST may be disposed in each of the each of the sub-pixels SPXn as described above. FIG. 5 is a diagram for showing relative arrangements between the elements disposed in the display area DPA and the pad area PDA. It is, however, to be understood that the structure of the display device 10 is not limited thereto.

Referring to FIG. 5 in conjunction with FIG. 4, the display device 10 may include a substrate 11, a semiconductor layer disposed on the substrate 11, conductive layers, and insulating layers. The semiconductor layer, the conductive layers and the insulating layers may form a circuit layer and an emission layer of the display device 10.

For example, the substrate 11 may be an insulating substrate. The substrate 11 may be made of an insulating material such as glass, quartz and a polymer resin. The substrate 11 may be either a rigid substrate or a flexible substrate that can be bent, folded, or rolled. According to an embodiment, the substrate 11 is a flexible substrate. The substrate 11 may include the display area DPA, the non-display area NDA and the pad area PDA.

A bottom metal layer BML, may be disposed on the substrate 11. The bottom metal layer BML may overlap an active layer ACT1 of the first transistor T1 in the display area DPA. The bottom metal layer BML may include a material that blocks light, and thus can prevent light from entering the active layer ACT1 of the first transistor T1. The bottom metal layer BML may be electrically connected to the source electrode S1 of the first transistor T1 through a contact hole to suppress a change in the voltage of the first transistor T1. For example, the bottom metal layer BML may be formed of an opaque metal material that blocks light transmission, and may be made up of a Ti/Cu double layer in which a titanium layer and a copper layer may be stacked each other. It is, however, to be understood that the disclosure is not limited thereto. The bottom metal layer BML may be eliminated.

The buffer layer 12 may be disposed entirely on the substrate 11, including the bottom metal layer BML. For example, the buffer layer 12 may be disposed across the display area DPA and the pad area PDA of the substrate 11. The buffer layer 12 may be formed on the substrate 11 to protect the first thin-film transistors T1 of the pixels PX from moisture permeating through the substrate 11 that is susceptible to moisture permeation, to provide a flat surface. The buffer layer 12 may be formed of inorganic layers stacked alternately each other. For example, the buffer layer 12 may be made up of multiple layers in which inorganic layers including at least one of a silicon oxide ($SiO_x$), a silicon nitride ($SiN_x$) and silicon oxynitride (SiON) may be alternately stacked each other.

The semiconductor layer may be disposed on the buffer layer 12. The semiconductor layer may include the active layer ACT1 of the first transistor T1 disposed in the display area DPA. These may be disposed to partially overlap a gate electrode G1 of a first gate conductive layer, etc., which will be described later.

The semiconductor layer may include polycrystalline silicon, monocrystalline silicon, an oxide semiconductor, etc., within the spirit and the scope of the disclosure. In case that the semiconductor layer may include an oxide semiconductor, each active layer ACT1 may include conductive regions and a channel region therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc., within the spirit and the scope of the disclosure.

In other embodiments, the semiconductor layer may include polycrystalline silicon. The polycrystalline silicon may be formed by crystallizing amorphous silicon, and, the conductive regions of the active layer ACT1 may be doped regions doped with impurities.

The first gate insulating layer 13 may be disposed on the semiconductor layer and the buffer layer 12 across the display area DPA and the pad area PDA. The first gate insulating layer 13 may work as a gate insulator of each of the thin-film transistors. The first gate insulating layer 13 may be formed of an inorganic layer including an inorganic material, such as silicon oxide ($SiO_x$), silicon nitride ($SiN_x$) and silicon oxynitride (SiON), or may be formed of a stack of the materials.

The first gate conductive layer may be disposed on the first gate insulating layer 13. The first gate conductive layer may include a gate electrode G1 of the first transistor T1 disposed in the display area DPA and a gate pad WPD_G disposed in the pad area PDA. The gate electrode G1 may be disposed so that it overlaps the channel region of the active layer ACT1 in the thickness direction.

Although not shown in the drawings, the first gate conductive layer may further include a first capacitance electrode of the storage capacitor CST disposed in the display area DPA, the above-described scan line SCL, the sensing line SSL, etc., within the spirit and the scope of the disclosure.

According to an embodiment, the first gate conductive layer may include the gate pad WPD_G disposed in the pad area PDA. Wiring pads WPD may be disposed in the pad area PDA located or disposed on one side or a side of the non-display area NDA of the display device 10. The wires pads WPD may be connected to the external device EXD mounted thereon through the pad electrodes PAR1 and PAR2. The gate pad WPD_G may be electrically connected to the wiring pads WPD. For example, although not shown in the drawings, the wiring pads WPD may be connected to the gate pad WPD_G through a contact hole. Electric signals applied from the external device EXD to the wiring pads WPD may be transmitted to the first gate conductive layer through the gate pad WPD_G. Electrical signals applied to the display area DPA through the wiring pads WPD may be transmitted through a conductive layer disposed on a different layer from the wiring pads WPD, so that the display area DPA can be completely sealed from outside air. It is, however, to be understood that the disclosure is not limited thereto. The gate pad WPD_G of the first gate conductive layer may be eliminated.

The first gate conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first interlayer dielectric layer 15 may be disposed on the first gate conductive layer. The first interlayer dielectric layer 15 may serve as an insulating layer between the first gate conductive layer and other layers disposed thereon. The first interlayer dielectric layer 15 may be disposed so that it covers the first gate conductive layer to protect it. The first interlayer dielectric layer 15 may be formed of an inorganic layer including an inorganic material, such as silicon oxide ($SiO_x$), silicon nitride ($SiN_x$) and silicon oxynitride (SiON), or may be formed of a stack of the materials.

The first data conductive layer may be disposed on the first interlayer dielectric layer 15. The first data conductive layer may include the first source electrode S1 and the first drain electrode D1 of the first transistor T1 disposed in the display area DPA, and a data pad WPD_D disposed in the pad area PDA.

The source or drain electrodes S1 and D1 of the first transistor T1 may be in contact with the doping regions of the active layer ACT1, respectively, through the contact holes penetrating through the first interlayer dielectric layer 15 and the first gate insulating layer 13. The first source electrode S1 of the first transistor T1 may be electrically connected to the bottom metal layer BML through another contact hole.

Although not shown in the drawings, the first data conductive layer may further include a second capacitance electrode of the storage capacitor CST disposed in the display area DPA, the above-described data line DTL, etc., within the spirit and the scope of the disclosure.

According to an embodiment, the first data conductive layer may include the data pad WPD_D disposed in the pad area PDA. Similar to the gate pad WPD_G, the data pad WPD_D may be electrically connected to the wiring pads WPD. For example, although not shown in the drawings, the wiring pads WPD may be connected to the data pad WPD_D through a contact hole, and an electrical signal applied from the external device EXD to the wiring pads WPD may be transmitted to the first data conductive layer. It is, however, to be understood that the disclosure is not limited thereto. The data pad WPD_D of the first data conductive layer may be eliminated.

The first data conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The second interlayer dielectric layer 17 may be disposed on the first data conductive layer. The second interlayer dielectric layer 17 may serve as an insulating layer between the first data conductive layer and other layers disposed thereon. The second interlayer dielectric layer 17 may cover the first data conductive layer to protect it. The second interlayer dielectric layer 17 may be formed of an inorganic layer including an inorganic material, such as silicon oxide ($SiO_x$), silicon nitride ($SiN_x$) and silicon oxynitride (SiON), or may be formed of a stack of the materials.

The second data conductive layer may be disposed on the second interlayer dielectric layer 17. The second data conductive layer may include a first voltage line VL1, a second voltage line VL2 and a first conductive pattern CDP disposed in the display area DPA, and the wiring pads WPD a dummy pad WDD disposed in the pad area PDA.

A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode 22. An alignment signal for aligning the light-emitting elements 30 during the process of fabricating the display device 10 may be applied to the second voltage line VL2.

The first conductive pattern CDP may be connected to the source electrode S1 of the first transistor T1 through a contact hole formed in the second interlayer dielectric layer 17. The first conductive pattern CDP may be electrically connected to the first drain electrode D1 and may also be in contact with a first electrode 21 to be described later. The first transistor T1 may transmit the first supply voltage applied from the first voltage line VL1 to the first electrode 21 through the first conductive pattern CDP. Although the second data conductive layer may include one second voltage line VL2 and one first voltage line VL1 in the example shown in the drawings, the disclosure is not limited thereto. The second data conductive layer may include more than one first voltage lines VL1 and second voltage lines VL2.

The wiring pad WPD may be disposed in the pad area PDA and connected to the external device EXD mounted thereon. According to an embodiment, the wiring pad WPD may be connected to the external device EXD through first pad electrode PAR1 disposed thereon. An alignment signal for aligning the conductive particles COB to be described later may be applied to the wiring pad WPD during the process of fabricating the display device 10.

The dummy pad WDD may be disposed in the pad area PDA and may be connected to the second pad electrode PAR2 disposed thereon. An alignment signal for aligning the conductive particles COB, which will be described later, may be applied to the dummy pad WDD. The dummy pad WDD may not be connected to any line in the display area DPA of the display device 10 and may be connected to the second pad electrode PAR2 in the pad area PDA. The wiring pad WPD and the dummy pad WDD will be described in detail later.

The second data conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer or planarization layer 19 may be disposed on the second data conductive layer. The first planarization layer 19 may be disposed entirely in the display area DPA and the pad area PDA to provide a flat surface. The first planarization layer 19 may include an organic insulating material, for example, an organic material such as polyimide (PI). According to an embodiment, the first planarization layer 19 may be disposed so that the wiring pad WPD and the dummy pad WDD in the pad area PDA are partially exposed. It should be understood, however, that the disclosure is not limited thereto. The first planarization layer 19 is not disposed in the pad area PDA and may be eliminated.

On the first planarization layer 19 in the display area DPA, bank patterns BP1 and BP2, electrodes 21 and 22, light-emitting elements 30, connection electrodes CNE1 and CNE2, and a bank BNL may be disposed. Insulating layers PAS1, PAS2 and PAS3 may be disposed on the first planarization layer 19. In the pad area PDA, the pad electrodes PAR1 and PAR2 and the insulating layers PAS1 and PAS3 may be disposed on the first planarization layer 19. Hereinafter, a display element layer disposed in the display area DPA will be described, and the pad area PDA will be described.

The bank patterns BP1 and BP2 may be disposed in the display area DPA of the substrate 11. For example, the bank patterns BP1 and BP2 may be disposed on the first planarization layer 19. The bank patterns BP1 and BP2 may have a shape extended in the second direction DR2 within each of the sub-pixels SPXn, and may not be extended to an adjacent sub-pixel SPXn in the second direction DR2. For example, the length of the bank patterns BP1 and BP2 in the second direction DR2 may be smaller than the length of the emission area EMA of each of the sub-pixels SPXn so that they are not extended to the subsidiary area SA and other sub-pixels PXn.

The bank patterns BP1 and BP2 may include a first bank pattern BP1 and a second bank pattern BP2. The first bank pattern BP1 and the second bank pattern BP2 may be spaced apart from each other in the first direction DR1. The first bank pattern BP1 and the second bank pattern BP2 may have a constant width in the first direction DR1 and a constant length in the second direction DR2. The first bank pattern BP1 and the second bank pattern BP2 may be disposed in the emission area EMA of each of the sub-pixels SPXn, and may be formed in an island pattern.

Although two bank patterns BP1 and BP2 are disposed in the emission area EMA of one sub-pixel SPXn in the example shown in the drawings, the disclosure is not limited thereto. More than two bank patterns BP1 and BP2 may be further disposed depending on the number of electrodes 21 and 22 to be described later. The shape of the bank patterns BP1 and BP2 is not limited thereto, and may be disposed across different sub-pixels SPXn.

The bank patterns BP1 and BP2 may have a structure that at least partly protrudes from the upper surface of the first planarization layer 19. The protruding portions of the bank patterns BP1 BP2 may have inclined side surfaces. The lights emitted from the light-emitting elements 30 may be reflected by the electrodes 21 and 22 disposed on the bank patterns BP1 and BP2 so that the lights may exit toward the upper side of the first planarization layer 19. The bank patterns BP1 and BP2 may provide the area in which the light-emitting elements 30 are disposed and may also serve as reflective partition walls that reflect lights emitted from the light-emitting elements 30 upward. The side surfaces of the bank patterns BP1 and BP2 may be inclined in a linear shape, but the disclosure is not limited thereto. The bank patterns BP1 and BP2 may have an outer surface in a semi-circular or semi-elliptical shape. The bank patterns BP1 and BP2 may include, but is not limited to, an organic insulating material such as polyimide (PI).

The electrodes 21 and 22 may be disposed on the bank patterns BP1 and BP2 and the first planarization layer 19. The electrodes 21 and 22 may include the first electrode 21 and the second electrode 22. The first and second electrodes 21 and 22 may be extended in the second direction DR2 and may be spaced apart from each other in the first direction DR1.

The first electrode 21 and the second electrode 22 may be extended in the second direction DR2 in each of the sub-pixels SPXn, and they may be spaced apart from other electrodes 21 and 22 in the subsidiary area SA. For example, the subsidiary area SA may be disposed between the emission areas EMA of the neighboring sub-pixels SPXn in the second direction DR2, and the first electrode 21 and the second electrode 22 may be separated from other first electrode 21 and second electrode 22 disposed in an adjacent sub-pixel SPXn in the second direction DR2 in the subsidiary area SA. It is, however, to be understood that the disclosure is not limited thereto. Some or a number of electrodes 21 and 22 may not be separated for each of the sub-pixels SPXn but may be extended and disposed across adjacent sub-pixels SPXn in the second direction DR2. For example, only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may be in contact with the first conductive pattern CDP through the first contact hole CT1 penetrating the first planarization layer 19. The second electrode 22 may come in contact with the second voltage line VL2 through a second contact hole CT2 penetrating through the first planarization layer 19. It is, however, to be understood that the disclosure is not limited thereto.

Although one first electrode 21 and one second electrode 22 are disposed for each of the sub-pixels SPXn in the drawings, the disclosure is not limited thereto. More than one first electrode 21 and more than one second electrodes 22 may be disposed in each of the sub-pixels SPXn. The first electrode 21 and the second electrode 22 disposed in each of the sub-pixels SPXn may not necessarily have a shape extended in one direction or a direction but may have a variety of structures. For example, the first electrode 21 and the second electrode 22 may have a partially curved or bent shape, and one electrode may be disposed to surround the other electrode.

The first electrode 21 and the second electrode 22 may be disposed on the bank patterns BP1 and BP2, respectively. The first electrode 21 and the second electrode 22 may have a larger width than the bank patterns BP1 and BP2. For example, the first electrode 21 and the second electrode 22 may be disposed to completely cover the bank patterns BP1 and BP2, respectively. The first electrode 21 and the second electrode 22 may be respectively disposed on the side surfaces of the bank patterns BP1 and BP2, and the distance between the first electrode 21 and the second electrode 22 may be smaller than the distance between the bank patterns BP1 and BP2. At least a portion of the first electrode 21 and the second electrode 22 may be disposed on or directly on the first planarization layer 19 so that they may be located or disposed on a same plane. It is, however, to be understood that the disclosure is not limited thereto. In some implementations, the electrodes 21 and 22 may have a width smaller than that of the bank patterns BP1 and BP2.

Each of the electrodes 21 and 22 may include a conductive material having a high reflectance. For example, each of the electrodes 21 and 22 may include a metal such as silver (Ag), copper (Cu) and aluminum (Al) as the material having a high reflectance, and may be an alloy including aluminum (Al), nickel (Ni), lanthanum (La), etc., within the spirit and the scope of the disclosure. The electrodes 21 and 22 may reflect light that is emitted from the light-emitting elements 30 and travels toward the side surfaces of the bank patterns BP1 and BP2 toward the upper side of each of the sub-pixels SPXn.

It is, however, to be understood that the disclosure is not limited thereto. Each of the electrodes 21 and 22 may further include a transparent conductive material. For example, each of the electrodes 21 and 22 may include a material such as indium tin oxide (ITO), indium zinc oxide (IZO) and indium tin zinc oxide (ITZO). In an embodiment, each of the electrodes 21 and 22 may have a structure in which one or more layers of a transparent conductive material and a metal layer having high reflectivity may be stacked, or may be made up of a single layer including them. For example, each of the electrodes 21 and 22 may have a stack structure such as ITO/silver (Ag)/ITO/, ITO/Ag/IZO, or ITO/Ag/ITZO/IZO.

The electrodes 21 and 22 may be electrically connected to the light-emitting elements 30, and a voltage may be applied so that the light-emitting elements 30 can emit light. The electrodes 21 and 22 may be electrically connected to the light-emitting element 30 through the connection electrodes CNE1 and CNE2, and may transfer electrical signals applied thereto to the light-emitting element 30 through the connection electrodes CNE1 and CNE2.

One of the first electrode 21 and the second electrode 22 may be electrically connected to an anode electrode of the light-emitting element 30, while the other one may be electrically connected to a cathode electrode of the light-emitting element 30. It is, however, to be understood that the disclosure is not limited thereto.

The electrodes 21 and 22 may be utilized to form an electric field within the sub-pixel SPXn to align the light-emitting elements 30. The light-emitting elements 30 may be disposed between the first electrode 21 and the second electrode 22 by an electric field formed on the first electrode 21 and the second electrode 22. The light-emitting elements 30 of the display device 10 may be sprayed on the electrodes 21 and 22 via an inkjet printing process. In case that droplets of the ink containing the light-emitting elements 30 are ejected onto the electrodes 21 and 22, an alignment signal is applied to the electrodes 21 and 22 to generate an electric field. The light-emitting elements 30 dispersed in the ink may be aligned on the electrodes 21 and 22 by receiving the electrophoretic force by the electric field generated over the electrodes 21 and 22.

The first insulating layer PAS1 may be disposed on the first planarization layer 19. The first insulating layer PAS1 may be disposed to cover the bank patterns BP1 and BP2, the first electrode 21 and the second electrode 22. The first insulating layer PAS1 may also be disposed in the pad area PDA. The first insulating layer PAS1 can protect the first electrode 21 and the second electrode 22 and insulate them from each other. It may prevent that the light-emitting element 30 disposed on the first insulating layer PAS1 is brought into contact with other elements and damaged.

The first insulating layer PAS1 may include first openings OP1 partially exposing the first electrode 21 and the second electrode 22. The first openings OP1 may partially expose portions of the electrodes 21 and 22 disposed on the bank patterns BP1 and BP2. Portions of the connection electrodes CNE1 and CNE2 may be in contact with the electrodes 21 and 22 exposed through the first openings OP, respectively.

The first insulating layer PAS1 may have a level difference so that a portion of the upper surface is recessed between the first electrode 21 and the second electrode 22. For example, as the first insulating layer PAS1 is disposed to cover the first electrode 21 and the second electrode 22, the upper surface thereof may have level differences along the shape of the electrodes 21 and 22 disposed thereunder. It is, however, to be understood that the disclosure is not limited thereto.

The bank BNL may be disposed on the first insulating layer PAS1. The bank BNL may be disposed in a lattice pattern on the front surface of the display area DPA including portions extended in the first direction DR1 and the second direction DR2 in case that viewed from the top. The bank BNL may be disposed along the border of each of the sub-pixels SPXn to distinguish between adjacent sub-pixels SPXn. The bank BNL may be disposed to surround the border of the display area DPA and may not be disposed in the pad area PDA.

The bank BNL may be disposed to surround the emission area EMA and the subsidiary area SA disposed in each of the sub-pixels SPXn to define them. The first electrode 21 and the second electrode 22 may be extended in the second direction DR2 and may be disposed across a portion of the bank BNL that is extended in the first direction DR1.

According to an embodiment, the bank BNL may be formed to have a greater height than the bank patterns BP1 and BP2. The bank BNL can prevent the ink in which different light-emitting elements 30 are dispersed from overflowing to adjacent sub-pixels SPXn during the inkjet printing process of the processes of fabricating the display device 10, so that different sub-pixels SPXn can be separated from one another and the ink is not mixed. The bank BNL may include, but is not limited to, polyimide (PI) like the bank patterns BP1 and BP2.

The light-emitting elements 30 may be disposed on the first insulating layer PAS1. The light-emitting elements 30 may be spaced apart from one another in the second direction DR2 in which the electrodes 21 and 22 are extended, and may be aligned substantially parallel to one another. The light-emitting elements 30 may have a shape extended in one direction or a direction. The direction in which the electrodes 21 and 22 are extended may be substantially perpendicular to the direction in which the light-emitting elements 30 are extended. It is, however, to be understood that the disclosure is not limited thereto. The light-emitting elements 30 may be oriented obliquely to the direction in which the electrodes 21 and 22 are extended, rather than being perpendicular to it.

The light-emitting elements 30 disposed in each of the sub-pixels SPXn may include emissive layers 36 (see FIG. 10) including different materials and may emit lights with different wavelength ranges to the outside. Accordingly, lights of the first color, the second color and the third color may exit from the first sub-pixel SPX1, the second sub-pixel SPX2 and the third sub-pixel SPX3 shown in FIG. 4, respectively. It is, however, to be understood that the disclosure is not limited thereto. The sub-pixels SPXn may include a same kind of light-emitting elements 30 and may emit light of substantially the same color.

The both ends of the light-emitting elements 30 may be disposed on the electrodes 21 and 22 between the bank patterns BP1 and BP2. The length of the light-emitting elements 30 may be larger than the distance between the first electrode 21 and the second electrode 22, and the both ends of the light-emitting elements 30 may be disposed to overlap the first electrode 21 and the second electrode 22, respectively. For example, one end or an end of each of the light-emitting elements 30 may be located or disposed on the first electrode 21, while the other end or another end thereof may be located or disposed on the second electrode 22.

Multiple layers of the light-emitting elements 30 may be disposed in the direction parallel to the upper surface of the substrate 11 or the first planarization layer 19. The light-emitting elements 30 may be arranged or disposed such that one extending direction or an extending direction is parallel to the upper surface of the first planarization layer 19, and semiconductor layers included in the light-emitting elements 30 may be disposed sequentially in the direction parallel to the upper surface of the first planarization layer 19. It is, however, to be understood that the disclosure is not limited thereto. In case that the light-emitting elements 30 has a different structure, semiconductor layers may be arranged or disposed in the direction perpendicular to the upper surface of the first planarization layer 19.

The both ends of each of the light-emitting elements 30 may be in contact with the connection electrodes CNE1 and CNE2, respectively. For example, a portion of the semiconductor layer of the light-emitting element 30 may be exposed because the insulating film 38 (see FIG. 10) is not formed at the end surface on the side of the extending direction, and the exposed portion of the semiconductor layer may be in contact with the connection electrode CNE1 and CNE2. It is, however, to be understood that the disclosure is not limited thereto. At least a portion of the insulating film 38 may be removed so that both end surfaces of the semiconductor layers of the light-emitting element 30 may be partially exposed. The exposed side surfaces of the semiconductor layer may be in contact with the connection electrodes CNE1 and CNE2.

The second insulating layer PAS2 may be partially disposed on the light-emitting elements 30. For example, the second insulating layer PAS2 may have a width smaller than the length of the light-emitting elements 30 and may be disposed on the light-emitting elements 30 so that the both ends of the light-emitting elements 30 are exposed while being surrounded by it. The second insulating layer PAS2 may be disposed to cover the light-emitting elements 30, the electrodes 21 and 22 and the first insulating layer PAS1 and may be removed so that the both ends of the light-emitting elements 30 are exposed during the process of fabricating the display device 10. The second insulating layer PAS2 may be extended in the second direction DR2 on the first insulating layer PAS1 in case that viewed from the top, thereby forming a linear or island-like pattern in each of the sub-pixels SPXn. The second insulating layer PAS2 can protect the light-emitting elements 30 and fix the light-emitting element 30 during the process of fabricating the display device 10.

The connection electrodes CNE1 and CNE2 may be disposed on the second insulating layer PAS2. The connection electrodes CNE1 and CNE2 may have a shape extended in one direction or a direction and may be disposed on the electrodes 21 and 22. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be spaced apart from each other or face each other. For example, the first connection electrode CNE1 and the second connection electrode CNE2 may be disposed on the first electrode 21 and the second electrode 22, respectively, and may be spaced apart from each other in the first direction DR1. The connection electrodes CNE1 and CNE2 may form a stripe pattern in the emission area EMA of each of the sub-pixels SPXn.

Each of the connection electrodes CNE1 and CNE2 may be in contact with the light-emitting elements 30. The first connection electrode CNE1 may be in contact with the first end of each of the light-emitting elements 30, and the second connection electrode CNE2 may be in contact with the second end of each of the light-emitting elements 30. The semiconductor layers are exposed at the both end surfaces of the light-emitting elements 30 in the extended direction, and the connection electrodes CNE1 and CNE2 may be in electrical contact with the semiconductor layers and may be electrically connected to them. The sides of the connection electrodes CNE1 and CNE2 in contact with the both ends of the light-emitting elements 30 may be disposed on the second insulating layer PAS2. The first connection electrode CNE1 may be in contact with the first electrode 21 through the first opening OP1 exposing a portion of the upper surface of the first electrode 21, and the second connection electrode CNE2 may be in contact with the second electrode 22 through the first opening OP1 exposing a portion of the upper surface of the second electrode 22.

The width of the connection electrodes CNE1 and CNE2 that is measured in one direction or a direction may be smaller than the width of the electrodes 21 and 22 that is measured in the direction. The connection electrodes CNE1 and CNE2 may be in contact with first ends and second ends of the light-emitting elements 30 and may cover a portion of the upper surface of each of the first electrode 21 and the second electrode 22. It is, however, to be understood that the disclosure is not limited thereto. The width of the connection electrodes CNE1 and CNE2 may be larger than that of the electrodes 21 and 22 to cover both sides of the electrodes 21 and 22.

The connection electrodes CNE1 and CNE2 may include a transparent conductive material. For example, the connection electrodes CNE1 and CNE2 may include ITO, IZO, ITZO, aluminum (Al), etc., within the spirit and the scope of the disclosure. Light emitted from the light-emitting elements 30 may pass through the connection electrodes CNE1 and CNE2 and travel toward the electrodes 21 and 22. It is, however, to be understood that the disclosure is not limited thereto.

Although the two connection electrodes CNE1 and CNE2 are disposed in one sub-pixel SPXn in the drawings, the disclosure is not limited thereto. The number of the connection electrodes CNE1 and CNE2 may vary depending on the number of electrodes 21 and 22 disposed for each of the sub-pixels SPXn.

The third insulating layer PAS3 may be disposed entirely on the display area DPA of the substrate 11. The third insulating layer PAS3 can protect elements disposed on the substrate 11 against the external environment. It is to be noted that the third insulating layer PAS3 may be eliminated.

Each of the above-described first insulating layer PAS1, second insulating layer PAS2 and third insulating layer PAS3 may include an inorganic insulating material or an organic insulating material. For example, the first insulating layer PAS1, the second insulating layer PAS2 and the third insulating layer PAS3 may include an inorganic insulating material such as silicon oxide ($SiO_x$), silicon nitride ($SiN_x$), silicon oxynitride ($SiO_xN_y$), aluminum oxide ($Al_2O_3$) and aluminum nitride (AlN). By way of example, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc., within the spirit and the scope of the disclosure. It is, however, to be understood that the disclosure is not limited thereto.

The display element layer disposed in the display area DPA may include the first electrode 21, the second electrode 22, the light-emitting elements 30 and the connection electrodes CNE1 and CNE2, so that light in a particular wavelength range can be emitted. External devices EXD that transmit driving signals for driving the sub-pixels SPXn may be mounted in the pad area PDA. The external device EXD may be, for example, an anisotropic conductive film (ACF). The external devices EXD may be connected to the wiring pad WPD in the pad area PDA. The external device EXD and the pad electrodes may be electrically connected with each other through conductive particles. These conductive particles need to be uniformly dispersed in the pad area PDA. If the conductive particles agglomerate between the pad electrodes, the adjacent pad electrodes may create a short-circuit, resulting in failure of the device. In the display device 10 using a flexible substrate, if the external device EXD and the pad electrodes are attached together by high-pressure bonding, the conductive particles or the pad electrodes may be damaged. In order to prevent such damage, it is necessary to perform low-pressure bonding. Unfortunately, it may be difficult to conduct electricity between the pad electrodes and the external device EXD in the low-pressure bonding because the conductive particles are spherical.

By way of example, the display device 10 can prevent defects due to agglomeration of conductive particles and can allow for low-pressure bonding will be described. The display device 10 according to an embodiment may include cylindrical conductive particles, and may include wiring pads WPD, a dummy pad WDD, and pad electrodes PAR1 and PAR2 disposed in a pad area PDA.

Referring to FIGS. 6 and 7 in conjunction with FIG. 5, a wiring pad WPD and a dummy pad WDD may be disposed on the second interlayer dielectric film 17 in the pad area PDA. The wiring pad WPD and the dummy pad WDD may be disposed on a same layer as the second data conductive layer. The wiring pad WPD and the dummy pad WDD may be extended in the second direction DR2 and may be spaced apart from each other in the first direction DR1. The wiring pad WPD and the dummy pad WDD may be disposed parallel to each other and may have a same length in the second direction DR2. It should be understood, however, that the disclosure is not limited thereto. The length of the dummy pad WDD may be smaller than the length of the wiring pad WPD.

Pairs of the wiring pad WPD and the dummy pad WDD may be repeatedly arranged or disposed in the first direction DR1. For example, they may be arranged or disposed in the order of the wiring pad WPD, the dummy pad WDD, the wiring pad WPD, the dummy pad WDD, and so on in the first direction DR1. It should be understood, however, that the disclosure is not limited thereto. Two dummy pads WDD may be disposed between two wiring pads WPD.

Each of the wiring pad WPD and the dummy pad WDD may have a width in the first direction DR1. According to an embodiment, the width W1 of the wiring pad WPD may be greater than the width W2 of the dummy pad WDD. The wiring pad WPD may be connected to a signal line extended from the display area DPA, for example, the above-described data line, voltage line, sensing line, etc. to receive or directly receive a signal. Accordingly, the wiring pad WPD may have a large width in consideration of resistance. The dummy pad WDD receives no signal transmitted to the display area DPA, and there is no need to consider resistance. Therefore, the dummy pad WDD may have a width smaller than that of the wiring pad WPD in order to make good use of the pad area PDA.

As described above, the wiring pad WPD receives a signal from the external device EXD and transmits a signal to the display area DPA, while the dummy pad WDD does not transmit any signal to the display area DPA. Accordingly, the dummy pad WDD is not connected to any line extended from the display area DPA other than the pad electrodes PAR1 and PAR2.

The first insulating layer PAS1 may be disposed not only in the display area DPA but also in the pad area PDA. The first insulating layer PAS1 may include a pad opening OP2 exposing the first through hole CH1 and the second through hole CH2 under or below the first pad electrode PAR1 and the second pad electrode PAR2. The first insulating layer PAS1 may expose the upper surface of the first planarization layer 19 as well.

Pad electrodes PAR1 and PAR2 may be disposed on the wiring pad WPD. According to an embodiment, the first pad electrode PAR1 may be disposed on the wiring pad WPD, and the second pad electrode PAR2 may be disposed on the dummy pad WDD.

The first pad electrode PAR1 and the second pad electrode PAR2 may be disposed on the first insulating layer PAS1. The first pad electrode PAR1 and the second pad electrode PAR2 may be disposed to partially cover the pad opening OP2 of the first insulating layer PAS1. The first pad electrode PAR1 may be disposed on or directly on the first planarization layer 19 disposed over the wiring pad WPD. According to an embodiment, the first pad electrode PAR1 may overlap the wiring pad WPD, and may be connected to the wiring pad WPD through the first through hole CH1 penetrating the first planarization layer 19.

The second pad electrode PAR2 may be disposed on or directly on the first planarization layer 19 disposed over the dummy pad WDD. The second pad electrode PAR2 may be disposed on a same layer as the first pad electrode PAR1 and may be spaced apart from it in the first direction DR1. The second pad electrode PAR2 and the first pad electrode PAR1 may be extended in the second direction DR2 and may be disposed parallel to each other. The second pad electrode PAR2 may overlap the dummy pad WDD and may be connected to the dummy pad WDD through the second through hole CH2 penetrating the first planarization layer 19. The second pad electrode PAR2 may have a width greater than that of the dummy pad WDD and may be in direct contact with the dummy pad WDD. The pad electrodes PAR1 and PAR2 may electrically connect the external device EXD with the wiring pad WPD and the dummy pad WDD.

According to an embodiment, the first pad electrode PAR1 and the second pad electrode PAR2 may be formed via a same process as the connection electrodes CNE1 and CNE2 of the display area DPA, and may include a same material or a similar material. The connection electrodes CNE1 and CNE2 may be formed in the display area DPA in a process after the bank BNL is formed. The bank BNL may not be disposed in the pad area PDA, and the wiring pad WPD and the dummy pad WDD may be exposed during subsequent processes of fabricating the display device 10. The first pad electrode PAR1 and the second pad electrode PAR2 may be formed via a same process as the connection electrodes CNE1 and CNE2 and disposed on the wiring pad WPD and the dummy pad WDD. By way of example, the pad electrodes PAR1 and PAR2 in the pad area PDA are formed using the layers disposed on the display element layer in the display area DPA, and thus the subsequent fabricating processes after the circuit layer has been formed can become less complicated.

The wiring pad WPD and the dummy pad WDD may be disposed on a same layer as the second data conductive layer and may include a same material or a similar material as them, for example, a metal material such as copper (Cu). The connection electrodes CNE1 and CNE2 and the pad electrodes PAR1 and PAR2 may include a transparent, conductive material. For example, they may include ITO, IZO, ITZO, aluminum (Al), etc., within the spirit and the scope of the disclosure.

The third insulating layer PAS3 may be disposed on the pad electrodes PAR1 and PAR2. The third insulating layer PAS3 may be disposed not only in the display area DPA but also in the pad area PDA. The third insulating layer PAS3 may include a pad opening PAO exposing the first pad electrode PAR1 and the second pad electrode PAR2. The pad opening PAO of the third insulating layer PAS3 may allow the conductive particles COB to be described later to come in contact with the first pad electrode PAR1 and the second pad electrode PAR2.

As described above, on the pad area PDA, the external device EXD may be electrically connected to the pad electrodes PAR1 and PAR2 in the pad area PDA through the conductive particles.

Referring to FIG. 8, the external device EXD may be bonded and disposed on the pad area PDA of the substrate 11. The external device EXD may be a flexible printed circuit board with a driver IC. The external device EXD may include circuit lines CFC. The circuit lines CFC may be associated with the wiring pads WPD in the pad area PDA, respectively. The circuit lines CFC may be extended in the second direction DR2 like the wiring pads WPD and may be spaced apart from one another in the first direction DR1.

Conductive particles COB and a non-conductive layer NCF may be disposed between the substrate 11 in the pad area PDA and the external device EXD. The conductive particles COB may be in contact with the circuit lines CFC of the external device EXD and with the pad electrodes PAR1 and PAR2 in the pad area PDA, to electrically connect between them.

According to an embodiment, the conductive particles COB may have a shape extended in a direction. The conductive particles COB may have a shape of a cylinder, a rod, a wire, a tube, etc., within the spirit and the scope of the disclosure. It is to be understood that the shape of the conductive particles COB is not limited thereto. The conductive particles COB may have a variety of shapes including a polygonal column shape such as a cube, a cuboid and a hexagonal column, or a shape that is extended in a direction with partially inclined outer surfaces. The length of the conductive particles COB may be in a range of about 1 to about 10 μm, for example, about 2 to about 5 μm. It is, however, to be understood that the disclosure is not limited thereto. The diameter of the cross section perpendicular to the longitudinal direction of the conductive particles COB may be in a range of about 1 to about 10 μm, for example about 1 to 5 about μm. It is, however, to be understood that the disclosure is not limited thereto.

According to this embodiment, the conductive particles COB may have a cylindrical shape. As discussed above, if the external device EXD and the pad electrodes PAR1 and PAR2 are attached together by low-pressure bonding, the conductive particles COB having a cylindrical shape can readily achieve surface contact between the external device EXD and the pad electrodes PAR1 and PAR2 in the longitudinal direction of the conductive particles COB. For example, even in case that a low pressure is applied to the conductive particles COB having the cylindrical shape, the surface having a large area can be readily achieved in the longitudinal direction of the cylinder. Accordingly, the conductive particles COB form the surface contact with the external device EXD bonded thereon and also with the pad electrodes PAR1 and PAR2 bonded thereunder. Therefore, the cylindrical conductive particles COB can lower the contact resistance between the external device EXD and the pad electrodes PAR1 and PAR2 in the low-pressure bonding, so that an electrical signal can be readily transmitted. The conductive particles COB may have a size of several hundred nanometers with insulated surface. A conductive particle COB may include a conductive layer BC and a capping layer BIN surrounding the conductive layer BC. The conductive layer BC may have a cylindrical shape and may be surrounded by the capping layer BIN. For example, the capping layer BIN may be disposed on the bottom and side surface of the cylindrical conductive layer BC to completely surround the conductive layer BC. The conductive layer BC of the conductive particle COB may be conductive particles such as nickel, gold, platinum and copper. The capping layer BIN may be made of a polymer such as styrene and acrylic.

The conductive particles COB are dispersed in the non-conductive layer NCF, and may be distributed more in some portions and less in some other portions. For example, a region where many conductive particles COB are distributed, the conductive particles COB may be agglomerated, so that the pad electrodes PAR1 and PAR2 and the circuit lines CFC of the external device EXD may not be connected to each other, respectively. For example, one pad electrode may be connected to a number of circuit lines, a number of pad electrodes may be connected to one circuit line, or a number of pad electrodes may be connected to a number of circuit lines. On the contrary, a region where the conductive particles COB are distributed less, no conductive particle may exist at certain locations, and thus the pad electrodes PAR1 and PAR2 may not be electrically connected to the circuit lines CFC. Therefore, the distribution of the conductive particles COB is not uniform, resulting in the failure of the device.

According to this embodiment, as in a method of fabricating a display device to be described later, the conductive particles COB are aligned on the pad electrodes PAR1 and PAR2 using a dielectrophoresis method, so that the pad electrodes PAR1 and PAR2 and the circuit lines CFC of the external device EXD can be connected with each other reliably.

The conductive particles COB may be applied together with the non-conductive layer NCF on the external device EXD and aligned in the pad area PDA. If the external device EXD is pressurized with high heat, the capping layer BIN on the surface of each of the conductive particles COB may be broken and the conductive layer BC therein is exposed, thereby exhibiting conductivity. Accordingly, the conductive particles COB can have insulating properties as well as conductive properties.

The non-conductive layer NCF in which the conductive particles COB are dispersed may be disposed between the external device EXD and the substrate 11. The non-conductive layer NCF is a non-conductive, for example, an insulating adhesive, and may include at least one selected from a thermosetting resin and a thermoplastic resin. Examples of the thermosetting resin include, but are not limited to, bisphenol-A type epoxy resin, bisphenol-F type epoxy resin, novolak type epoxy resin, phenol resin, urea resin, melamine resin, unsaturated polyester resin, resorcinol resin, etc., within the spirit and the scope of the disclosure. Examples of the thermoplastic resin include, but are not limited to, saturated polyester resin, vinyl resin, acrylic resin, polyolefin resin, polyvinyl acetate (PVA) resin, polycarbonate resin, cellulose resin, ketone resin, styrene resin, etc., within the spirit and the scope of the disclosure.

According to an embodiment, the upper portions of the conductive particles COB may be in direct contact with the circuit lines CFC of the external device EXD, and the lower portions of the conductive particles COB may be in contact with the pad electrodes PAR1 and PAR2 in the pad area PDA. For example, the side surfaces of the conductive particles COB having a cylindrical shape may be in direct contact with the pad electrodes PAR1 and PAR2 and the circuit lines CFC. Accordingly, the circuit lines CFC of the external device EXD and the pad electrodes PAR1 and PAR2 may be electrically connected to each other by the conductive particles COB. The conductive particles COB may overlap the pad electrodes PAR1 and PAR2 in the pad area PDA.

The non-conductive layer NCF may be in direct contact with the lower surface of the external device EXD and the circuit lines CFC, and may be in contact with the pad electrodes PAR1 and PAR2 in the pad area PDA and the third insulating layer PASS. The non-conductive layer NCF may work as an adhesive to adhere and fix the external device EXD to the pad area PDA of the substrate 11.

According to an embodiment, a signal applied through the circuit lines CFC of the external device EXD is transmitted to the pad electrodes PAR1 and PAR2 by the conductive particles COB. In this instance, the signal transmitted to the first pad electrode PAR1 may be transmitted to the lines of the display area DPA through the wiring pad WPD. On the other hand, the signal transmitted to the second pad electrode PAR2 is transmitted to the dummy pad WDD, but the dummy pad WDD is not connected to other lines, and thus the signal is not transmitted. According to this embodiment, the dummy pad WDD is disposed between the wiring pads WPD to prevent signal interference between the wiring pads WPD.

According to an embodiment, the conductive particles COB are aligned on the pad electrodes PAR1 and PAR2 using a dielectrophoresis method, so that the pad electrodes PAR1 and PAR2 and the circuit lines CFC can be connected with each other reliably. Accordingly, it is possible to prevent a short-circuit from being created between the adjacent circuit lines CFC or the adjacent pad electrodes PAR1 and PAR2 due to agglomeration of the conductive particles COB, and to prevent the failure of the device.

According to an embodiment, some layers disposed in the display area DPA and the pad area PDA of the display device 10 can be formed altogether via a same process, so that the fabricating process can be become less complicated. By way of example, in the pad area PDA, the pad electrodes PAR1 and PAR2 that may include a same material or a similar material as that of the connection electrodes CNE1 and CNE2 in the display area DPA and are formed together with them are disposed, so that an additional process of forming a pad electrode for connection with the external device EXD can be omitted. The display device 10 can have a novel pad electrode structure including the light-emitting elements 30, and the fabrication process can be relatively simplified.

FIG. 10 is a view showing a light-emitting element according to an embodiment.

According to an embodiment, the light-emitting element 30 of the display device 10 may be a light-emitting diode. For example, the light-emitting element 30 may have a size in micrometers or nanometers and may be an inorganic light-emitting diode made of an inorganic material. Inorganic light-emitting diodes may be aligned between two electrodes facing each other as polarities are created by forming an electric field in a particular direction between the two electrodes. The light-emitting element 30 may be aligned between two electrodes by an electric field formed over the two electrodes.

The light-emitting element 30 according to an embodiment may have a shape extended in one direction or a direction. The light-emitting element 30 may have a shape of a cylinder, a rod, a wire, a tube, etc., within the spirit and the scope of the disclosure. It is to be understood that the shape of the light-emitting element 30 is not limited thereto. The light-emitting element 30 may have a variety of shapes including a polygonal column shape such as a cube, a cuboid and a hexagonal column, or a shape that is extended in a direction with partially inclined outer surfaces. The semiconductors included in the light-emitting element 30 to be described later may have a structure sequentially arranged or disposed or stacked along the one direction or a direction.

The light-emitting element 30 may include a semiconductor layer doped with impurities of a conductive type (for example, p-type or n-type). The semiconductor layers may emit light of a certain wavelength band by transmitting an electric signal applied from an external power source.

As shown in FIG. 10, the light-emitting element 30 may include a first semiconductor layer 31, a second semiconductor layer 32, an emissive layer 36, an electrode layer 37 and an insulating layer 38.

The first semiconductor layer 31 may be an n-type semiconductor. In case that the light-emitting element 30 emits light of a blue wavelength band, the first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The first semiconductor layer 31 may be doped with an n-type dopant, and the n-type dopant may be Si, Ge, Sn, Se, etc., within the spirit and the scope of the disclosure. For example, the first semiconductor layer 31 may be n-GaN doped with n-type Si. The length of the first semiconductor layer 31 may range, but is not limited to, from about 1.5 μm to about 5 μm.

The second semiconductor layer 32 may be disposed on the emissive layer 36 to be described later. The second semiconductor layer 32 may be a p-type semiconductor. In case that the light-emitting element 30 emits light of a blue or green wavelength band, the second semiconductor layer 32 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Ba, etc., within the spirit and the scope of the disclosure. For example, the second semiconductor layer 32 may be p-GaN doped with p-type Mg. The length of the second semiconductor layer 32 may range, but is not limited to, from about 0.05 μm to about 0.10 μm.

Although each of the first semiconductor layer 31 and the second semiconductor layer 32 is implemented as a signal layer in the drawings, the disclosure is not limited thereto. Depending on the material of the emissive layer 36, the first semiconductor layer 31 and the second semiconductor layer 32 may further include a larger number of layers, for example, a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. In case that the emissive layer 36 may include a material having the multiple quantum well structure, the structure may include quantum layers and well layers alternately stacked each other. The emissive layer 36 may emit light as electron-hole pairs are combined therein in response to an electrical signal applied through the first semiconductor layer 31 and the second semiconductor layer 32. In case that the emissive layer 36 emits light of the blue wavelength band, it may include a material such as AlGaN and AlGaInN. By way of example, in case that the emissive layer 36 has a multi-quantum well structure in which quantum layers and well layers may be alternately stacked each other, the quantum layers may include AlGaN or AlGaInN, and the well layers may include a material such as GaN and AlGaN. For example, the emissive layer 36 may include AlGaInN as the quantum layer and AlInN as the well layer, and, as described above, the emissive layer 36 may emit blue light having a center wavelength band in a range of about 450 nm to about 495 nm.

It is, however, to be understood that the disclosure is not limited thereto. The emissive layer 36 may have a structure in which a semiconductor material having a large band gap energy and a semiconductor material having a small band gap energy may be alternately stacked each other, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations. The length of the emissive layer 36 may be, but is not limited to, in a range of about 0.05 μm to about 0.10 μm.

The light emitted from the emissive layer 36 may exit not only through the outer surfaces of the light-emitting element 30 in the longitudinal direction but also through the both side surfaces. The direction in which the light emitted from the emissive layer 36 propagates is not limited to one direction or s direction.

The electrode layer 37 may be an ohmic connection electrode. It is, however, to be understood that the disclosure is not limited thereto. The electrode layer 37 may be a Schottky connection electrode. The light-emitting element 30 may include at least one electrode layer 37. Although the light-emitting element 30 may include one electrode layer 37 in the example shown in FIG. 10, the disclosure is not limited thereto. In some implementations, the light-emitting element 30 may include a larger number of electrode layers 37 or the electrode layer may be omitted. The following description on the light-emitting element 30 may be equally applied even if the number of electrode layers 37 is different or it further may include other structures.

The electrode layer 37 can reduce the resistance between the light-emitting element 30 and the electrodes or the connection electrodes in case that the light-emitting element 30 is electrically connected to the electrodes or the connection electrodes in the display device 10 according to an embodiment. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 37 may include a semiconductor material doped with n-type or p-type impurities. The electrode layer 37 may include a same material or a similar material or may include different materials. It is, however, to be understood that the disclosure is not limited thereto.

The insulating film 38 may be disposed to surround outer surfaces of the semiconductor layers and electrode layers described above. For example, the insulating film 38 may be disposed to surround at least the outer surface of the emissive layer 36, and may be extended in a direction in which the light-emitting element 30 is extended. The insulating film 38 can protect the above-described elements. The insulating film 38 may be formed to surround the side surfaces of the elements, and both ends of the light-emitting element 30 in the longitudinal direction may be exposed.

Although the insulating film 38 is extended in the longitudinal direction of the light-emitting element 30 to cover from the first semiconductor layer 31 to the side surface of the electrode layer 37 in the example shown in the drawing, the disclosure is not limited thereto. The insulating film 38 may cover only the outer surface of a portion of the semiconductor layer, including the light-emitting layer 36, or may cover only a part a portion of the outer surface of the electrode layer 37 to partially expose the outer surface of the electrode layer 37. A portion of the upper surface of the insulating film 38 may be rounded which is adjacent to at least one end or an end of the light-emitting element 30 in cross section.

The thickness of the insulating film 38 may be, but is not limited to, in a range of about 10 nm to about 1.0 μm. By way of example, the thickness of the insulating film 38 may be approximately 40 nm.

The insulating film 38 may include materials having an insulating property such as silicon oxide ($SiO_x$), silicon nitride ($SiN_x$), silicon oxynitride ($SiO_xN_y$), aluminum nitride (AlN) and aluminum oxide ($Al_2O_3$). Accordingly, it is possible to prevent an electrical short-circuit that may occur in case that the emissive layer 36 comes in contact with an electrode through which an electric signal is transmitted to the light-emitting element 30. Since the insulating film 38 may include the emissive layer 36 to protect the outer surface of the light-emitting element 30, it is possible to prevent a decrease in luminous efficiency.

The outer surface of the insulating film 38 may be subjected to surface treatment. The light-emitting elements 30 may be dispersed in an ink, and droplets of the ink may be ejected onto the electrode. In doing so, a surface treatment may be applied to the insulating film 38 so that it becomes hydrophobic or hydrophilic in order to keep the light-emitting elements 30 dispersed in the ink from being agglomerated with one another.

The length of the light-emitting element 30 may be in a range of about 1 μm to about 10 μm or about 2 μm to about 6 μm, and for example, about 3 μm to about 5 μm. The diameter of the light-emitting elements 30 may be in a range of about 30 nm to about 700 nm, and the aspect ratio of the light-emitting elements 30 may be in a range of about 1.2 to about 100. It is, however, to be understood that the disclosure is not limited thereto. The light-emitting elements 30 included in the display device 10 may have different diameters depending on compositional difference of the emissive layer 36. For example, the diameter of the light-emitting elements 30 may be approximately 500 nm.

Hereinafter, processing steps of fabricating the display device 10 will be described reference to other drawings.

FIGS. 11 to 25 are schematic cross-sectional views illustrating processing steps of a method of fabricating a display device according to an embodiment. In the following drawings, a processing step of forming the layers in the display area DPA and the pad area PDA will be described as an example.

Figure 11:
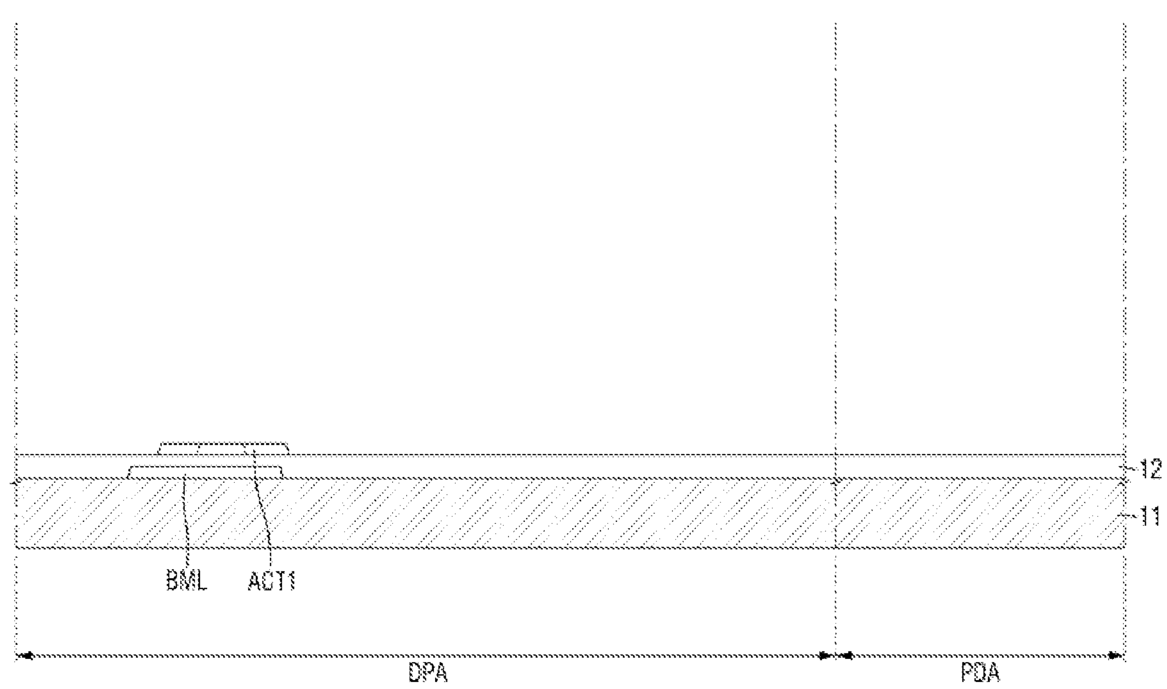
FIGS. 11 to 25 are schematic cross-sectional views illustrating processing steps of a method of fabricating a display device according to an embodiment.

Referring to FIG. 11, a bottom metal layer BML, is first formed on a substrate 11, and a buffer layer 12 and a semiconductor layer disposed thereon are formed. The bottom metal layer BML may be formed via a mask process. For example, a material layer for the bottom metal layer may be deposited entirely on the substrate 11 and patterned via a photolithography process, to form the bottom metal layer BML as shown in FIG. 11.

The buffer layer 12 may be formed by depositing a material layer for the buffer layer entirely on the substrate 11, and the semiconductor layer may include the active layer ACT1 of the first transistor T1, which may be formed via a mask process. For example, an oxide semiconductor may be deposited entirely on the buffer layer 12 and patterned via a photolithography process, to form the active layer ACT1 as shown in FIG. 11. Each of the layers may be formed via a process similar to the above-described process, and thus the redundant descriptions or detailed description thereof will be omitted, and a process sequence will be described in detail.

Figure 12:
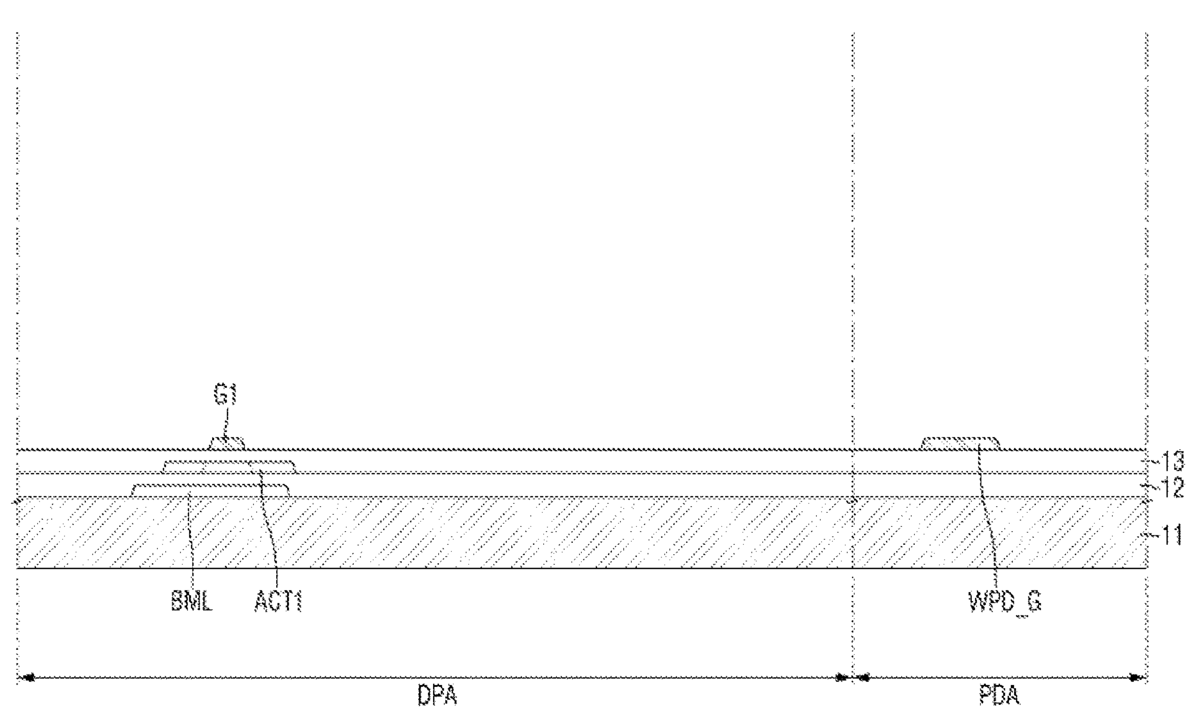

Subsequently, referring to FIG. 12, a first gate insulating layer 13 is formed over the semiconductor layer formed on the buffer layer 12, and a gate conductive layer is formed thereon. The gate conductive layer may include a gate electrode G1 disposed in the display area DPA and a gate pad WPD_G disposed in the pad area PDA. The first gate insulating layer 13 may be formed by depositing a material layer for the gate insulating layer entirely on the substrate 11, and the gate conductive layer may be formed via a mask process.

Figure 13:
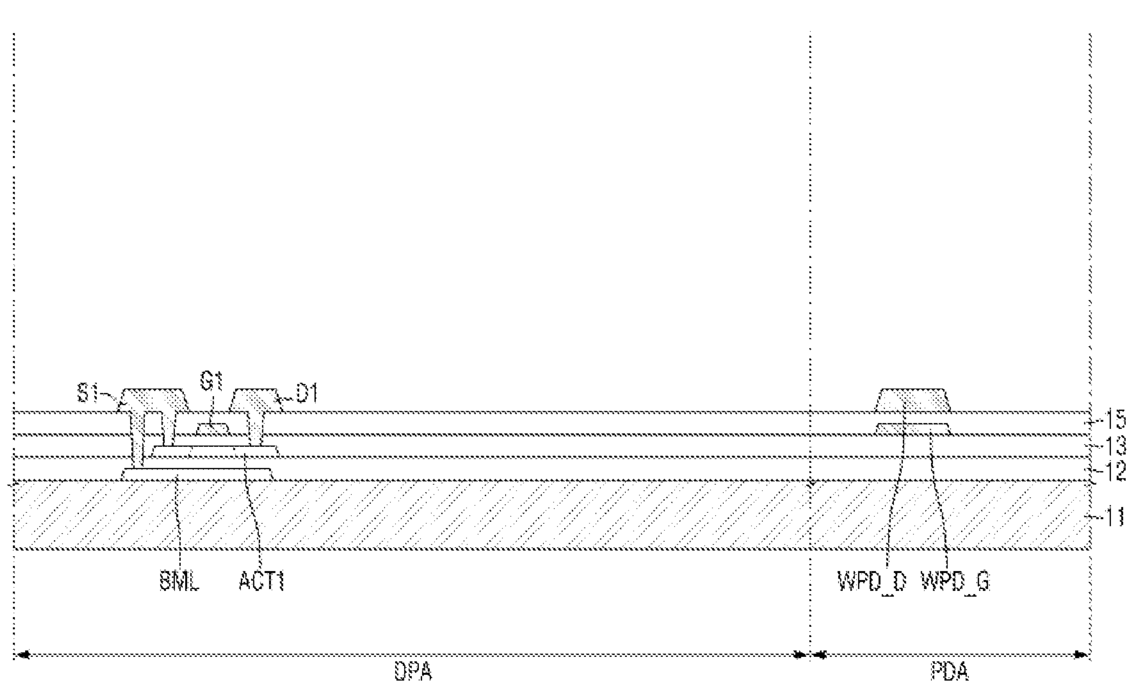

Subsequently, referring to FIG. 13, a first interlayer dielectric layer 15 is formed over the gate conductive layer formed the first gate insulating layer 13, and contact holes exposing portions of the bottom metal layer BML, and the semiconductor layer are formed. The first interlayer dielectric layer 15 may be formed by depositing a material layer for an interlayer dielectric layer entirely, and the contact holes may be formed via a mask process.

Subsequently, a first data conductive layer is formed on the first interlayer dielectric layer 15 in which the contact holes are formed. The first data conductive layer may be formed via a mask process. The first data conductive layer may include a source electrode 51 and a drain electrode D1 disposed in the display area DPA, and a data pad WPD D disposed in the pad area PDA. In the display area DPA, the materials of the first data conductive layer may be deposited down to the inside of the contact holes formed in the first interlayer dielectric layer 15 to be connected to the bottom metal layer BML or the active layer ACT1.

Figure 14:
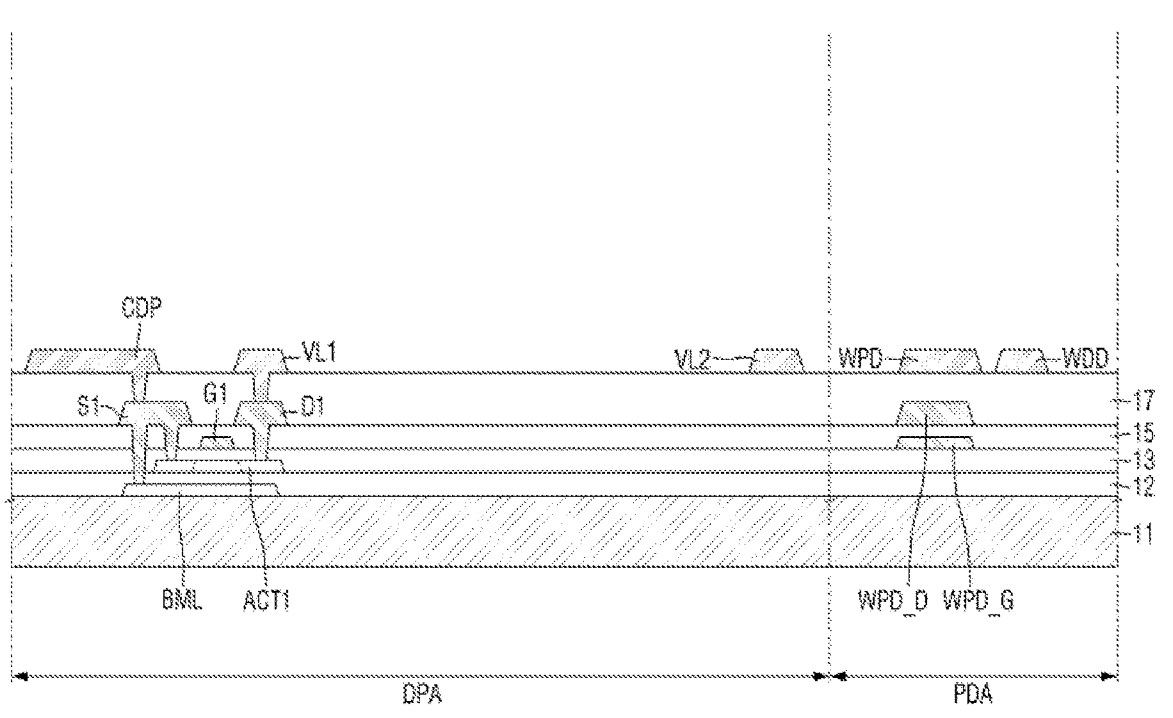

Subsequently, referring to FIG. 14, a second interlayer dielectric layer 17 is formed over the first data conductive layer formed on the first interlayer dielectric layer 15, and contact holes exposing portions of the first data conductive layer are formed. The second interlayer dielectric layer 17 and the contact holes may be formed in a same manner as the first interlayer dielectric layer 15.

Subsequently, a second data conductive layer is formed on the second interlayer dielectric layer 17 in which the contact holes are formed. The second data conductive layer may be formed via a mask process. The second data conductive layer may include voltage lines VL1 and VL2 and a first conductive pattern CDP disposed in the display area DPA, and a wiring pad WPD a dummy pad WDD disposed in the pad area PDA. In the display area DPA, the materials of the second data conductive layer may be deposited to the inside of the contact holes formed in the second interlayer dielectric layer 17 to be connected to the first data conductive layer.

Figure 15:
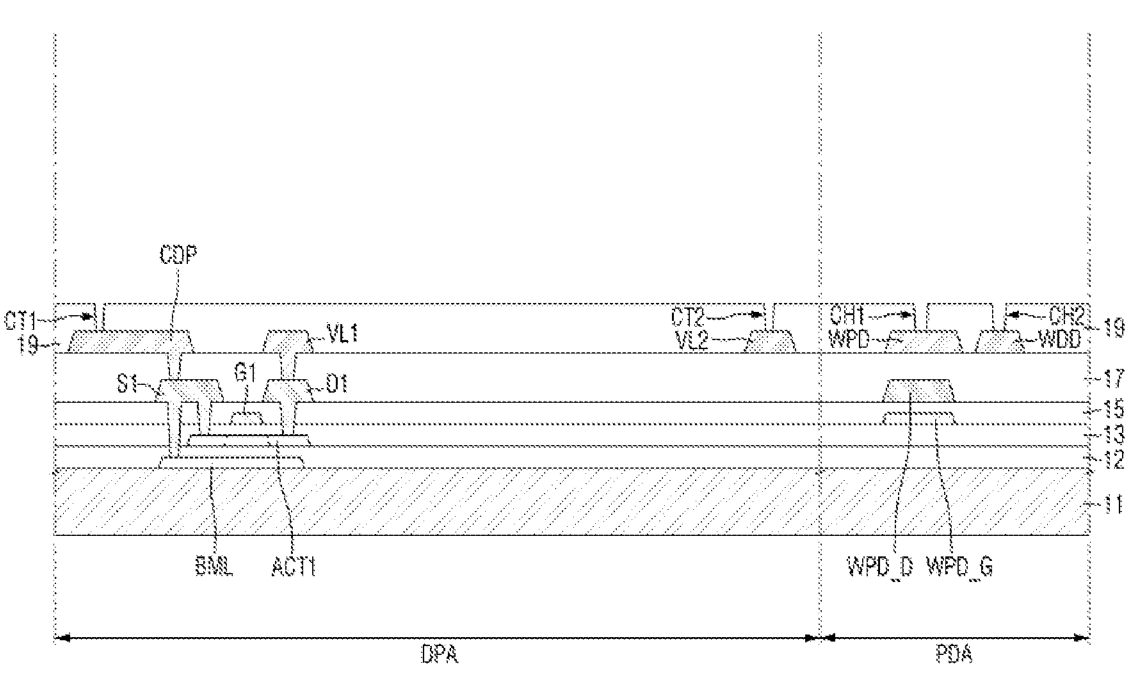

Subsequently, referring to FIG. 15, a first planarization layer 19 is formed over the second data conductive layer formed on the second interlayer dielectric layer 17. The first planarization layer 19 may include an organic material including a photosensitive material, and these may be formed through exposure and development after applying the organic material layer. A first contact hole CT1 exposing the first conductive pattern CDP and a second contact hole CT2 exposing the second voltage line VL2 may be formed in the first planarization layer 19 in the display area DPA. A first through hole CH1 exposing the wiring pad WPD and a second through hole CH2 exposing the dummy pad WDD may be formed in the first planarization layer 19 in the pad area PDA.

Figure 16:
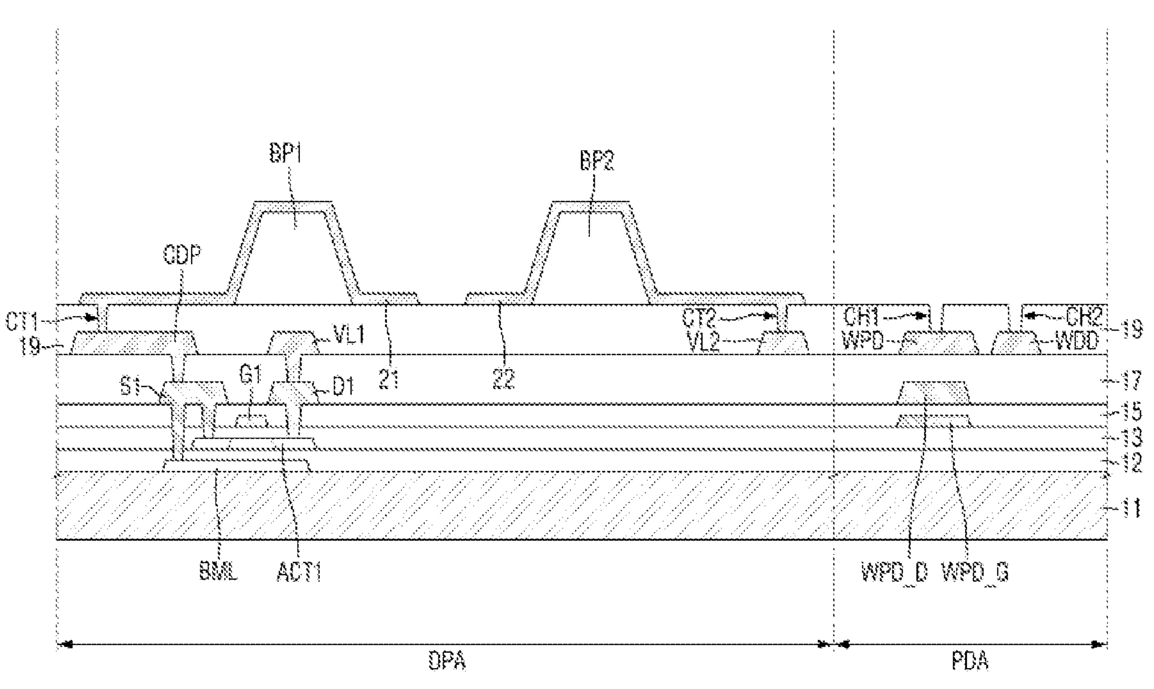

Subsequently, referring to FIG. 16, bank patterns BP1 and BP2 are formed on the first planarization layer 19 in the display area DPA. The bank patterns BP1 and BP2 may include an organic material including a photosensitive material, and these may be formed through exposure and development after applying the organic material layer. The bank patterns BP1 and BP2 may not be formed in the pad area PDA. Subsequently, the first electrode 21 and the second electrode 22 are formed on the first planarization layer 19 in the display area DPA. The first electrode 21 and the second electrode 22 may cover the bank patterns BP1 and BP2, respectively.

Figure 17:
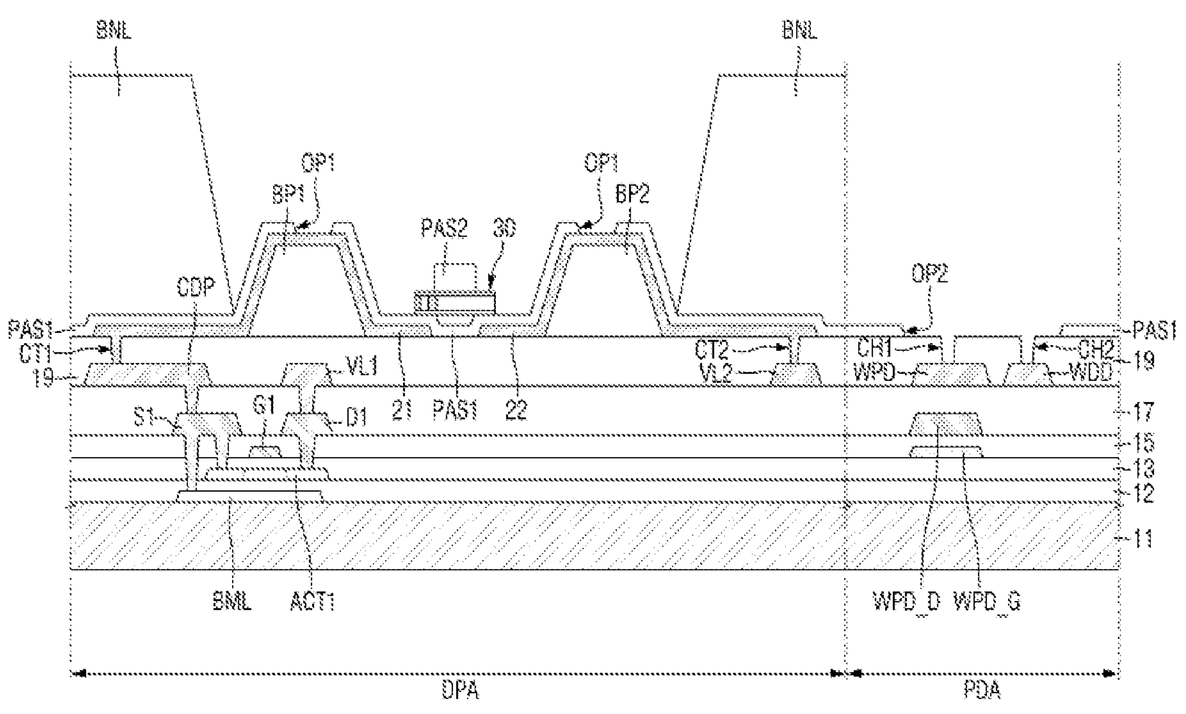

Subsequently, referring to FIG. 17, a first insulating layer PAS1 is formed on the first electrode 21 and the second electrode 22, and a bank BNL is formed on the first insulating layer PAS1 in the display area DPA. The first insulating layer PAS1 may be formed by depositing an insulating material layer entirely on the display area DPA and the pad area PDA. The bank BNL may be disposed on the first insulating layer PAS1 and may be formed via a same process as the bank patterns BP1 and BP2. The bank BNL may have a greater height than the bank patterns BP1 and BP2.

Subsequently, light-emitting elements 30 are disposed on the first insulating layer PAS1 in the display area DPA. According to an embodiment, the light-emitting elements 30 dispersed in an ink may be disposed on the electrodes 21 and 22 via an inkjet printing process in which the ink is ejected. The ink ejected from an inkjet printing apparatus may be seated in the area surrounded by the bank BNL. The bank BNL can prevent the ink from overflowing to other neighboring sub-pixels PXn.

In case that the ink containing the light-emitting elements 30 is ejected, an electrical signal is applied to the first electrode 21 and the second electrode 22, to arrange or dispose the light-emitting elements 30 on the first insulating layer PAS1. In case that an electric signal is applied to the first electrode 21 and the second electrode 22, an electric field may be generated on the first electrode 21 and the second electrode 22. The light-emitting elements 30 dispersed in the ink may be subjected to a dielectrophoresis force by the electric field, and thus the light-emitting elements 30 subjected to the dielectrophoresis force may be seated on the first insulating layer PAS1 while the orientations and positions are changed. The length of the light-emitting elements 30 may be larger than the distance between the first electrode 21 and the second electrode 22, and the both ends of the light-emitting elements 30 may be disposed on the first electrode 21 and the second electrode 22, respectively.

Subsequently, a second insulating layer PAS2 is formed to fix the positions of the light-emitting elements 30. The first insulating layer PAS1 is partially patterned to form a first opening OP1 exposing the first electrode 21 and the second electrode 22, and to form second openings OP2 exposing the first planarization layer 19, the first through hole CH1 and the second through hole CH2 in the pad area PDA. The second insulating layer PAS2 may be formed by depositing an insulating material layer entirely on the first insulating layer PAS1, and patterning it so that the both ends of the light-emitting elements 30 are exposed. The insulating material layer may not be deposited in that pad area PDA so that the second insulating layer PAS2 is not formed, or the material layer deposited in the pad area PDA may be completely removed. The first insulating layer PAS1 and the second insulating layer PAS2 may include different insulating materials, and the first insulating layer PAS1 may not be removed during the patterning process.

Figure 18:
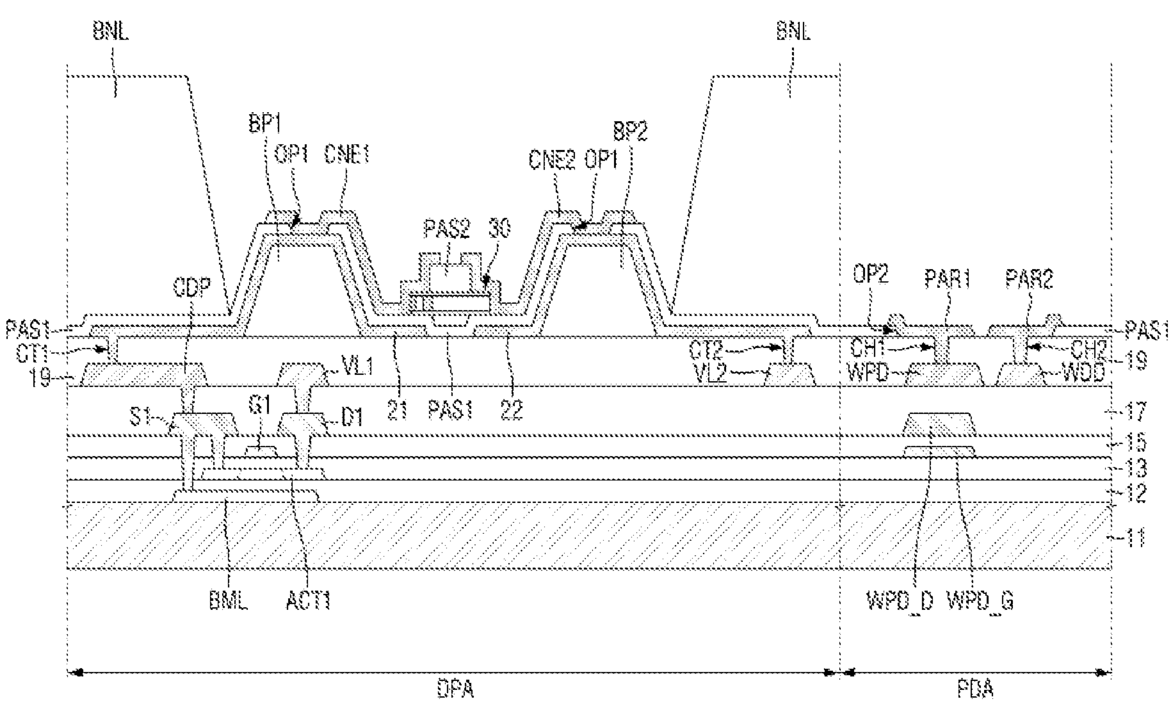

Subsequently, referring to FIG. 18, connection electrodes CNE1 and CNE2 are formed on the first insulating layer PAS1 and the second insulating layer PAS2, and pad electrodes PAR1 and PAR2 are formed on the pad area PDA. The first and second connection electrodes CNE1 and CNE2 and the first and second pad electrodes PAR1 and PAR2 may be formed by depositing a connection electrode material layer entirely on the first insulating layer PAS1 and the second insulating layer PAS2 to patterning it. The connection electrode material layer may be deposited down to the inside of the first opening OP1 and the second opening OP2 of the first insulating layer PAS1. Accordingly, the first connection electrode CNE1 may be connected to the first electrode 21, the second connection electrode CNE2 may be connected to the second electrode 22, the first pad electrode PAR1 may be connected to the wiring pad WPD, and the second pad electrode PAR2 may be connected to the dummy pad WDD.

The first connection electrode CNE1 and the second connection electrode CNE2 in the display area DPA and the first pad electrode PAR1 and the second pad electrode PAR2 in the pad area PDA may be simultaneously formed in a same process, and may include a same material or a similar material. In the display device 10, a mask process for forming the pad area PDA may be omitted by simultaneously forming the pad electrodes PAR1 and PAR2 in the pad area PDA in the process of forming the display element layer in the display area DPA.

Figure 19:
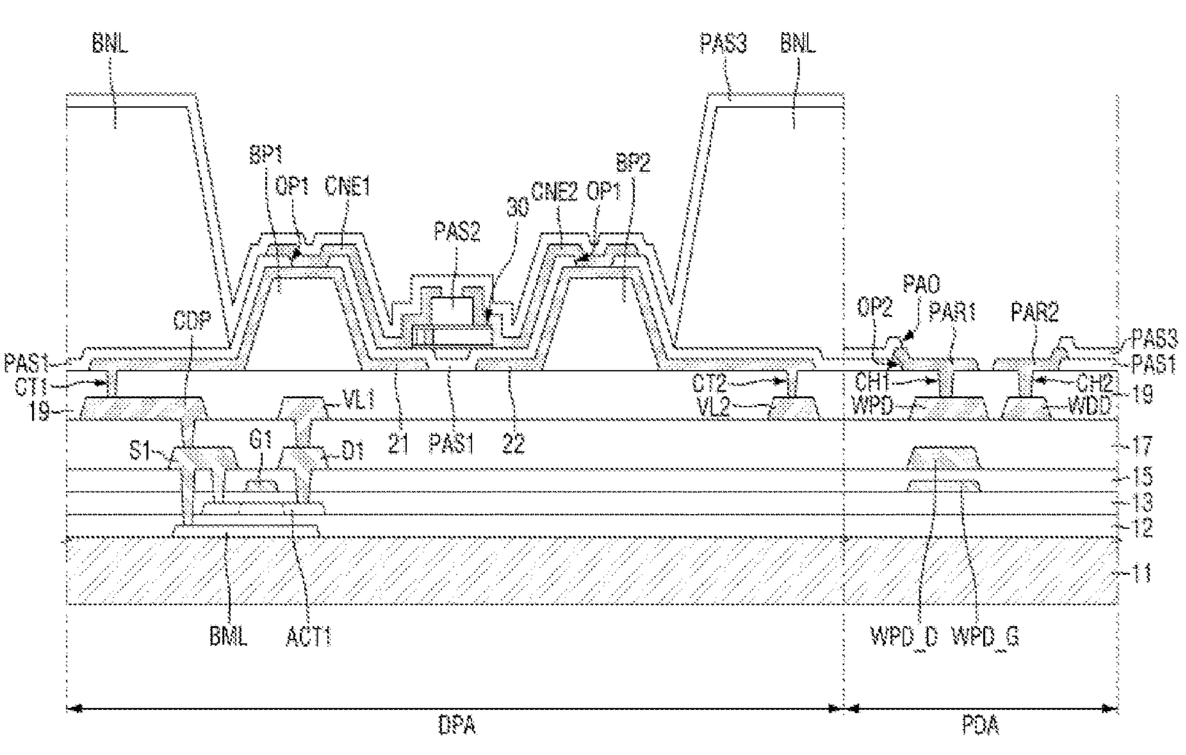

Subsequently, referring to FIG. 19, a third insulating layer PAS3 is formed on the connection electrodes CNE1 and CNE2 and the pad electrodes PAR1 and PAR2. The third insulating layer PAS3 may be formed by depositing an insulating material layer entirely on the display area DPA and the pad area PDA. The third insulating layer PAS3 is partially patterned to form a pad opening PAO exposing the pad electrodes PAR1 and PAR2.

Figure 20:
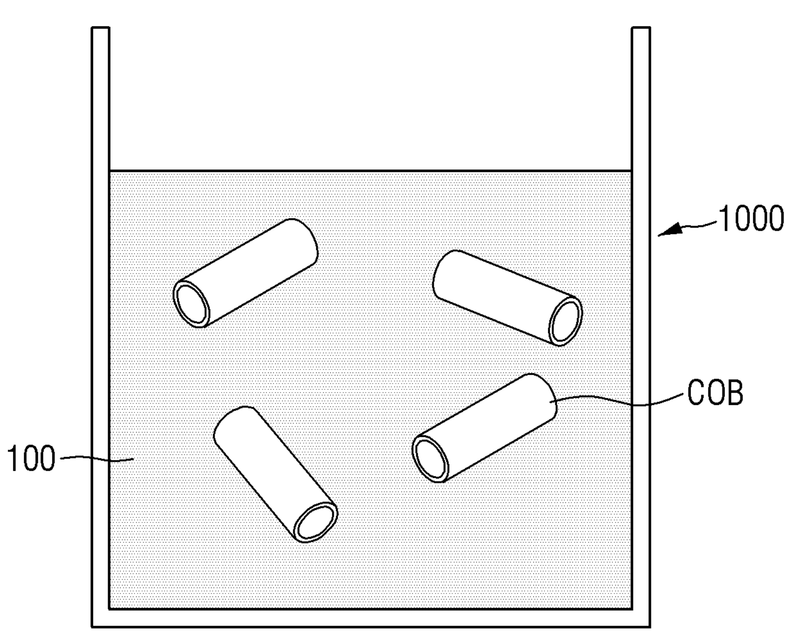

Subsequently, referring to FIG. 20, a conductive ink 1000 containing conductive particles COB and a solvent 100 is prepared. The conductive ink 1000 may contain the solvent 100 and the conductive particles COB dispersed therein. The solvent 100 may be, but is not limited to, a solvent such as toluene, water, and alcohol. According to this embodiment, each of the conductive particles COB may have a cylindrical shape.

Figure 21:
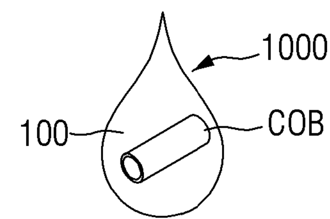
Figure 21:
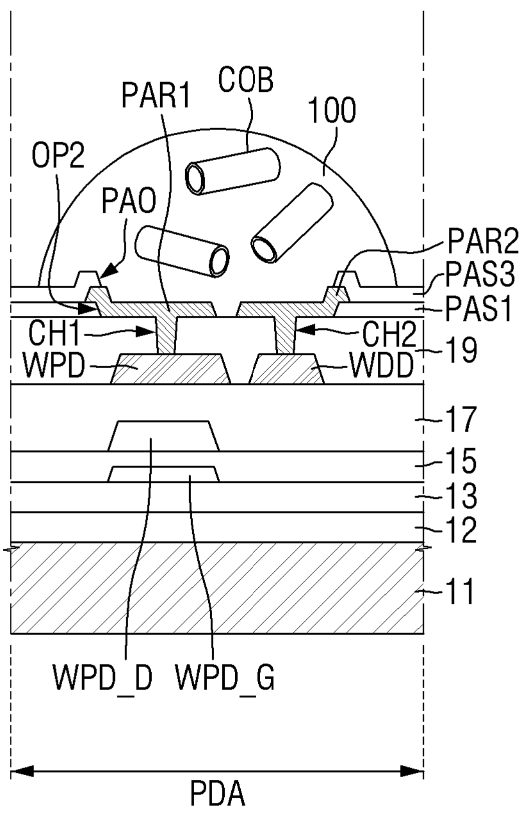

Subsequently, referring to FIG. 21, the conductive ink 1000 containing the conductive particles COB and the solvent 100 is ejected onto the pad area PDA of the substrate 11. According to an embodiment, the conductive ink 1000 may be ejected via a solution process. The solution process may use, for example, a printing process using an inkjet printing apparatus. The ejected conductive ink 1000 may be seated on the pad area PDA of the substrate 11. The conductive particles COB may be randomly dispersed in the conductive ink 1000.

Figure 22:
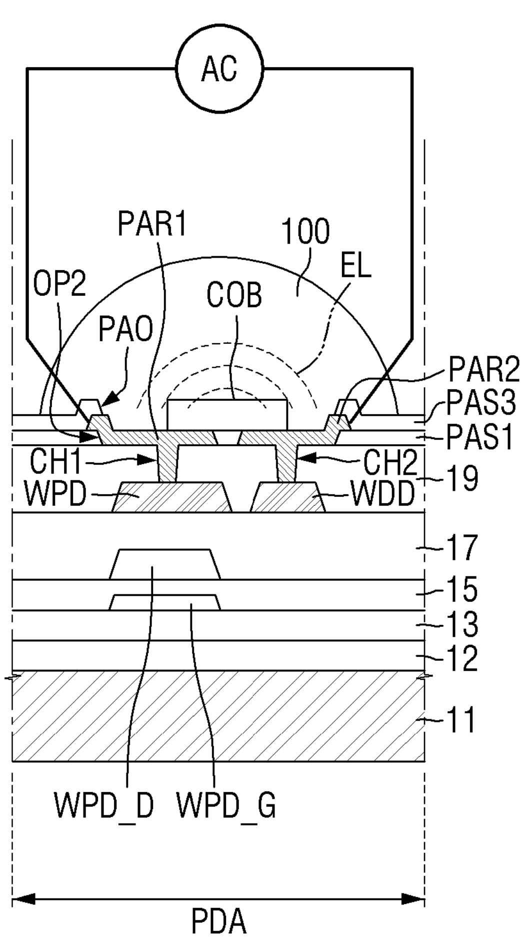

Subsequently, referring to FIG. 22, in case that the conductive ink 1000 containing the conductive particles COB is ejected onto the substrate 11, an alignment signal is applied to the pad electrodes PAR1 and PAR2 to form an electric field EL on the pad area PDA. The conductive particles COB dispersed in the solvent 100 may receive a dielectrophoretic force by the electric field EL, and may be disposed on the pad electrodes PAR1 and PAR2 while the positions are changed.

In case that the electric field EL is generated by applying an AC electric signal to the pad electrodes PAR1 and PAR2 in the pad area PDA, the conductive particles COB may receive a dielectrophoretic force. Dielectrophoresis can control the movement of non-charged particles. For example, in case that an alternating electric field is applied to a dielectric, an induced dipole is generated in the dielectric, and a net force is induced toward the region of higher electric field density, thereby controlling the movement of the dielectric. In case that the electric field EL generated in the pad area PDA is generated on the upper surface of the substrate 11, the conductive particles COB may move toward the pad electrodes PAR1 and PAR2 from positions where they are initially dispersed by the dielectrophoretic force. The conductive particles COB may be disposed on the pad electrodes PAR1 and PAR2 while their positions are changed by the electric field EL. The conductive particles COB are gathered and arranged or disposed on the pad electrodes PAR1 and PAR2 to electrically connect between the pad electrodes PAR1 and PAR2 and the circuit wiring CFC well. Since the conductive particles COB are well gathered on the pad electrodes PAR1 and PAR2, it is possible to prevent the conductive particles COB from being disposed between the adjacent pad electrodes, thereby preventing failure of the device.

Figure 23:
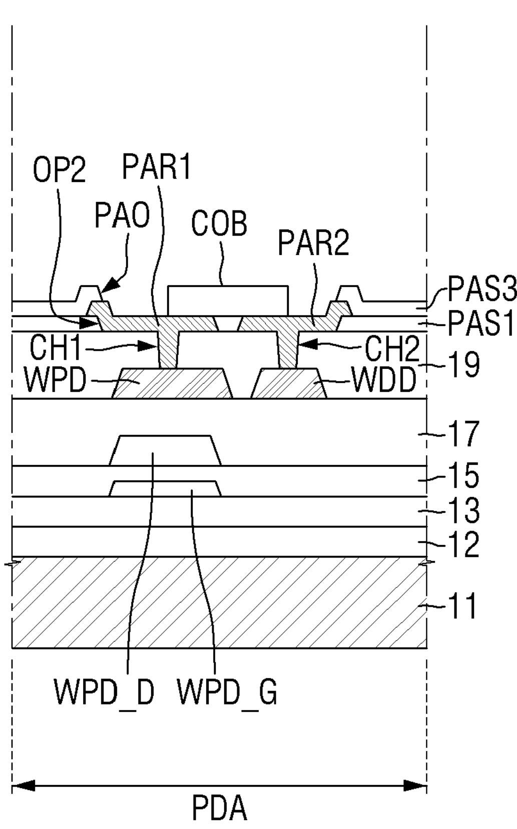

Subsequently, referring to FIG. 23, once the conductive particles COB are seated on the pad electrodes PAR1 and PAR2, the solvent 100 is removed. The process of removing the solvent 100 may be performed by a heat treatment process. The heat treatment process may be performed in a temperature in a range of about 200° C. to about 400° C., or about 300° C., but the disclosure is not limited thereto.

Figure 24:
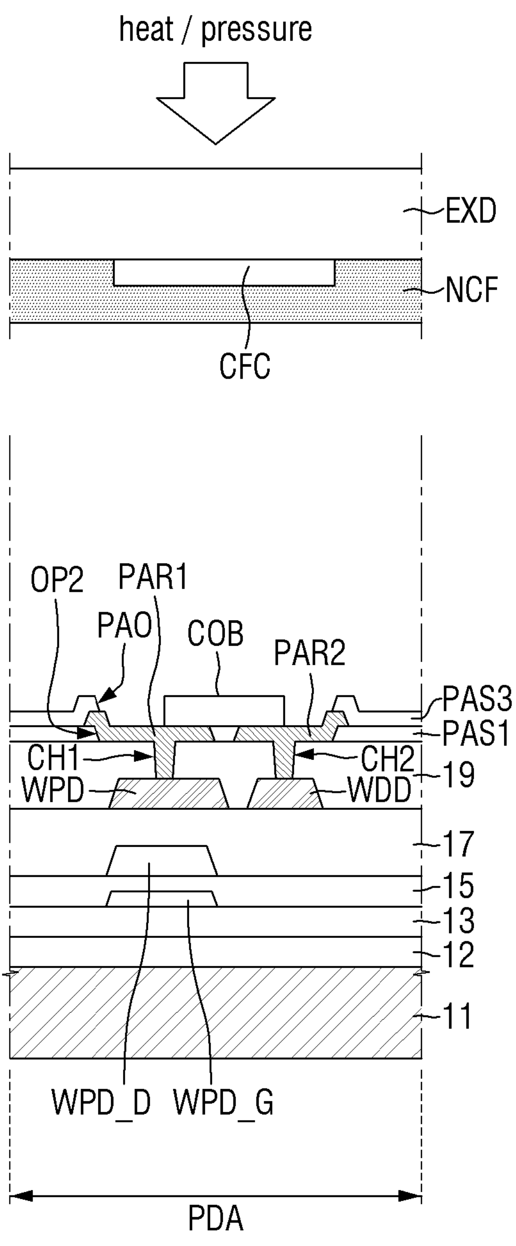

Subsequently, referring to FIG. 24, the external device EXD including the circuit lines CFC is aligned on the pad area PDA of the substrate 11. A non-conductive layer NCF covering the circuit lines CFC may be formed on one surface or a surface of the external device EXD. The external device EXD is aligned so that the pad electrodes PAR1 and PAR2 in the pad area PDA are aligned with the circuit lines CFC.

The external device EXD and the pad area PDA of the substrate 11 are bonded to each other by applying pressure while applying heat from above the external device EXD. At this time, the non-conductive layer NCF is thermally cured to bond the external device EXD to the substrate 11, and the capping layer of each of the conductive particles COB is broken by the pressure to expose the conductive layer therein.

Figure 25:
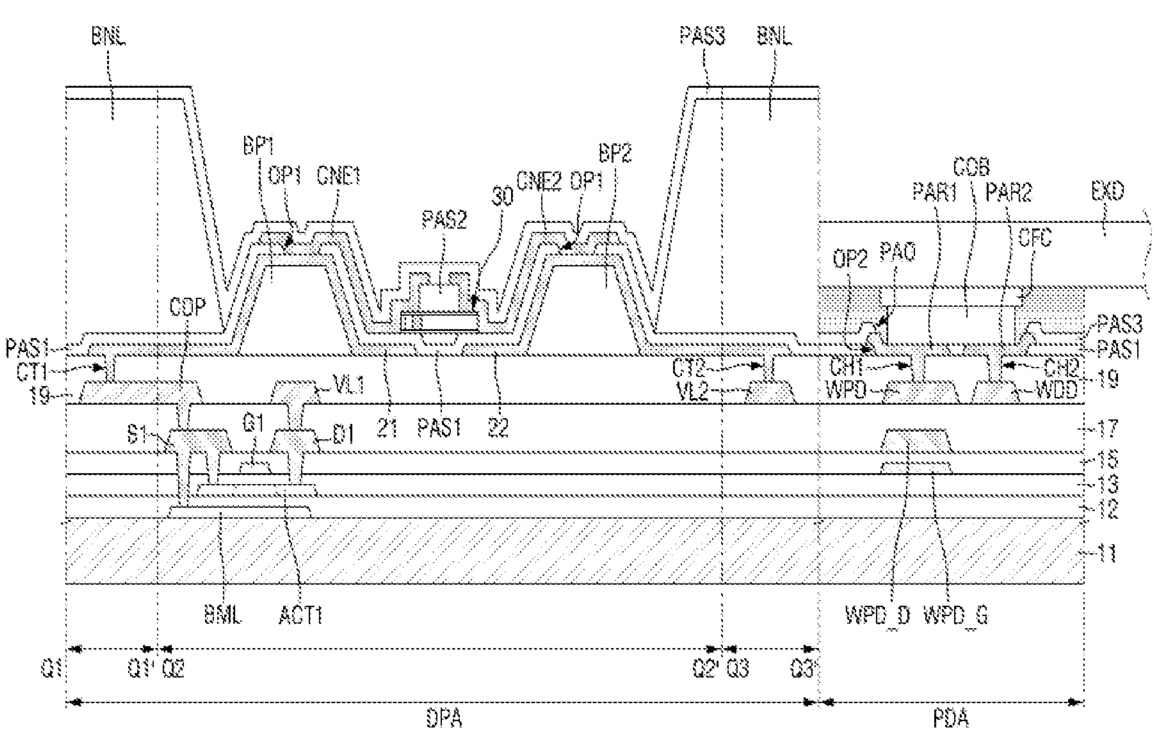

As shown in FIG. 25, the conductive particles COB may be in contact with the pad electrodes PAR1 and PAR2 in the pad area PDA and may be in contact with the circuit lines CFC of the external device EXD, so that the pad electrodes PAR1 and PAR2 may be electrically connected to the circuit lines CFC. According to an embodiment, since the conductive particles COB are formed in a cylindrical shape, a large-area surface contact between the pad electrodes PAR1 and PAR2 and the circuit lines CFC can be formed in low-pressure bonding, so that the contact resistance can be lowered.

Via the above processes, the display device 10 to which the external device EXD is bonded can be produced.

According to an embodiment, the conductive particles COB are aligned on the pad electrodes PAR1 and PAR2 using the dielectrophoresis in the device 10, so that it is possible to prevent a short-circuit from being created due to agglomeration of conductive particles COB, and to prevent the failure of the device.

According to an embodiment, the conductive particles COB have the cylindrical shape in the display device 10, so that the surface contact between the external device EXD and the pad electrodes PAR1 and PAR2 can be readily achieved in the low-pressure bonding process, and the contact resistance can be lowered, allowing electrical signals to be readily transmitted.

Hereinafter, display devices according to other embodiments will be described with reference to other drawings.

Figure 26:
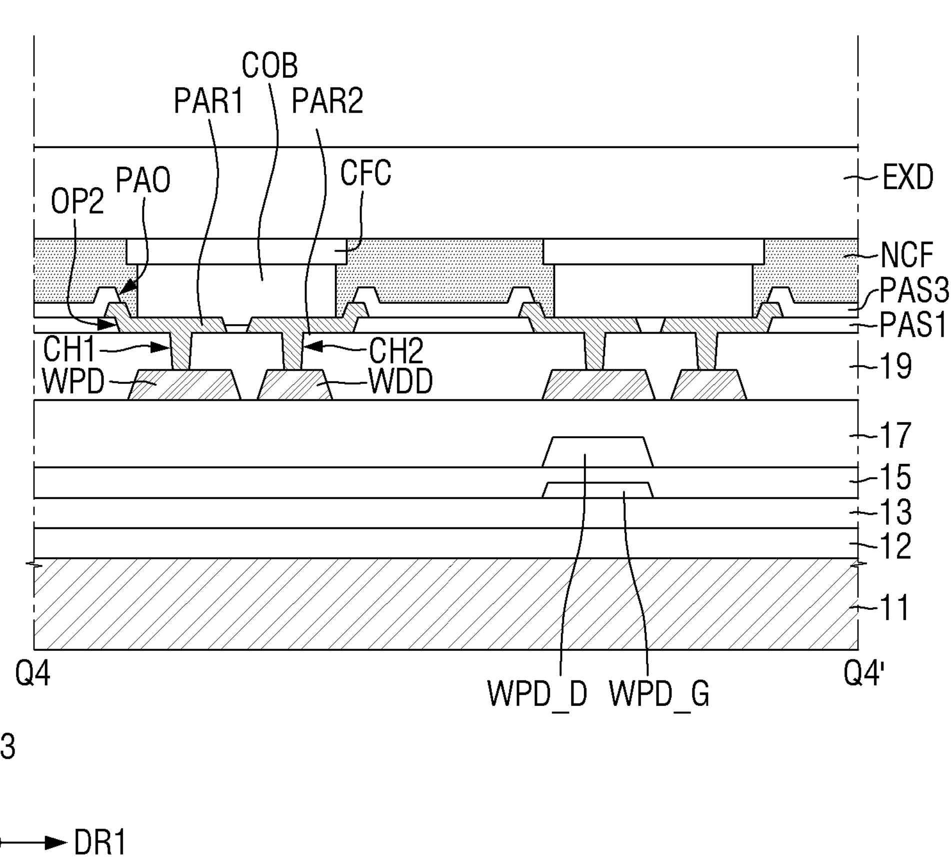
FIG. 26 is a schematic cross-sectional view showing a pad area of a display device according to an embodiment.
Figure 27:
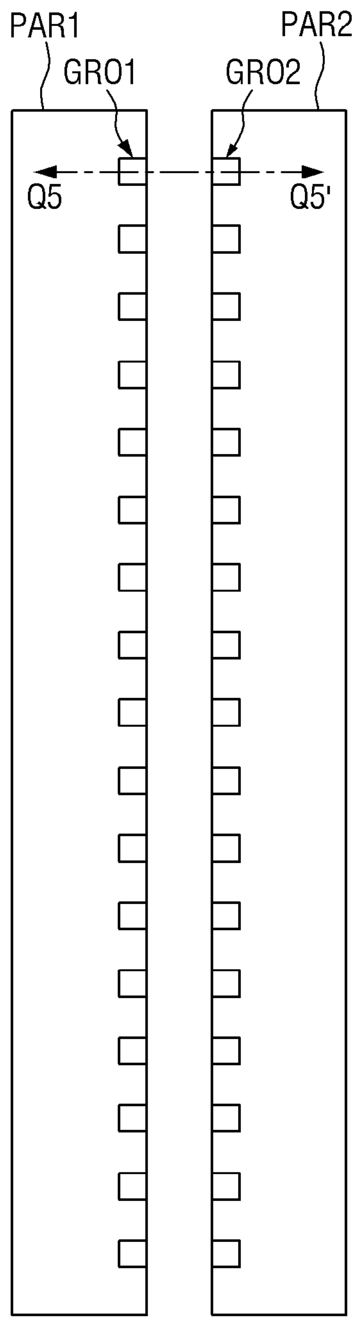
FIG. 27 is a schematic plan view schematically showing pad electrodes of a display device according to an embodiment of FIG. 28 is a schematic perspective view schematically showing pad electrodes of a display device according to an embodiment.
Figure 27:
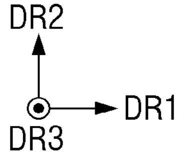
Figure 28:
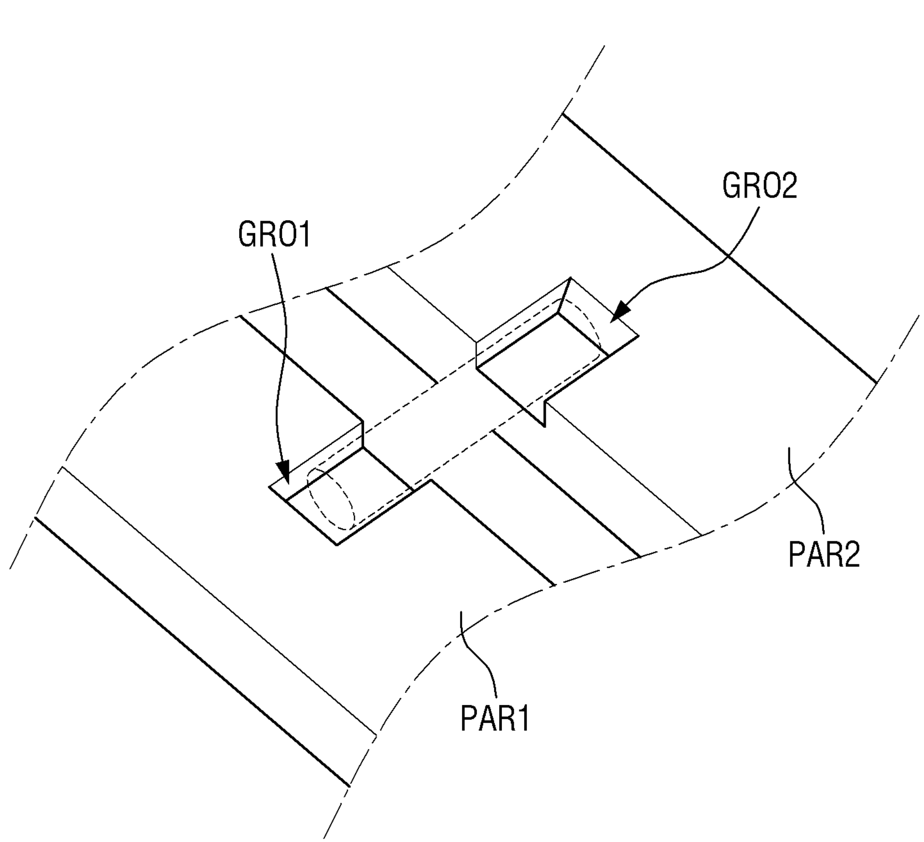
Figure 29:
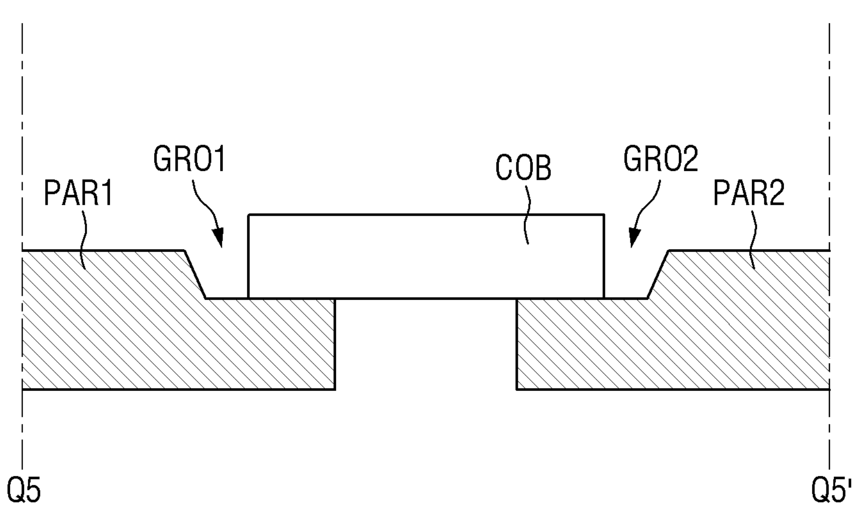
FIG. 29 is a schematic cross-sectional view taken along line Q5-Q5' of FIG. 27.

FIG. 26 is a schematic cross-sectional view showing a pad area of a display device according to an embodiment. FIG. 27 is a schematic plan view schematically showing pad electrodes of a display device according to an embodiment. FIG. 28 is a schematic perspective view schematically showing pad electrodes of a display device according to an embodiment. FIG. 29 is a schematic cross-sectional view taken along line Q5-Q5' of FIG. 27.

An embodiment of FIGS. 26 to 29 is substantially identical to the above-described embodiment of FIGS. 4 to 25 except that grooves GRO is formed in upper surfaces of the pad electrodes PAR1 and PAR2, and conductive particles COB are disposed in the grooves GRO; and, therefore, the redundant descriptions will be omitted.

The pad electrodes PAR1 and PAR2 may be spaced apart from each other and disposed parallel to each other in case that viewed from the top. The pad electrodes PAR1 and PAR2 may include grooves GRO formed on the sides facing each other. For example, grooves GRO may be formed on the right longer side of the first pad electrode PAR1, and on the left longer side of the second pad electrode PAR2.

The grooves GRO may include first grooves GRO1 formed on one side or a side of the first pad electrode PAR1, and second grooves GRO2 formed on one side or a side of the second pad electrode PAR2. Each of the grooves GRO may have a recessed shape in the thickness direction on one side or a side of each of the pad electrodes PAR1 and PAR2. For example, the first grooves GRO1 may have a recessed shape in the thickness direction of the first pad electrode PAR1 on one side or a side of the first pad electrode PAR1, and the second grooves GRO2 may have a recessed shape in the thickness direction of the second pad electrode PAR2 on one side or a side of the second pad electrode PAR2.

According to an embodiment, the grooves GRO may be opened toward each other in the pad electrodes PAR1 and PAR2. For example, the first grooves GRO1 may be opened toward the second grooves GRO2 of the second pad electrode PAR2, and the second grooves GRO2 may be opened toward the first grooves GRO1 of the first pad electrode PAR1.

The grooves GRO may be spaced apart from one another in the second direction DR2 in the pad electrodes PAR1 and PAR2. For example, the first grooves GRO1 may be spaced apart from one another in the second direction DR2, and the second grooves GRO2 may be spaced apart from one another in the second direction DR2 as well. The grooves GRO may be equally spaced apart from one another, but the disclosure is not limited thereto. They may have different distances, or some may have a same distance while the other may have different distances.

The grooves GRO may be aligned and coincide with one another in the first direction DR1. For example, the first grooves GRO1 and the second grooves GRO2 may be spaced apart from each other in the first direction DR1, and one of the first grooves GRO1 may be spaced apart from the respective one of the second grooves GRO2 in the first direction DR1. The first groove GRO1 and the second groove GRO2 that face each other in the first direction DR1 may be aligned and coincide with each other in the first direction DR1.

More than one grooves GRO may be disposed. The number of grooves GRO formed in each of the pad electrodes PAR1 and PAR2 may be 10 to 30. For example, the number of first grooves GRO1 formed in the first pad electrode PAR1 may be 10 to 30, and the number of second grooves GRO2 formed in the second pad electrode PAR2 may be 10 to 30. According to an embodiment, as will be described later, the number of first grooves GRO1 may be equal to the number of the second grooves GRO2 so that the both ends of the conductive particles COB may be disposed in the first grooves GRO1 and the second grooves GRO2, respectively.

Conductive particles COB may be disposed in the grooves GRO of the pad electrodes PAR1 and PAR2. The both ends of the conductive particles COB may be disposed on the pad electrodes PAR1 and PAR2, respectively. For example, the first ends of the conductive particles COB may be disposed on the first grooves GRO1 of the first pad electrode PAR1, and the second ends of the conductive particles COB may be disposed on the second groove GRO2 of the second pad electrode PAR2. The grooves GRO may be recessed in the thickness direction of the pad electrodes PAR1 and PAR2, and may have a depth. The depth of the grooves GRO may be smaller than the diameter of the conductive particles COB. If the depth of the grooves GRO is greater than the diameter of the conductive particles COB, the conductive particles COB are stacked in the groove GRO in the thickness direction, thereby making the electric connection difficult. The conductive particles COB disposed on the grooves GRO may partially protrude above the grooves GRO.

As described above, the conductive particles COB may be aligned on the pad electrodes PAR1 and PAR2 by an alignment signal applied to the pad electrodes PAR1 and PAR2. According to an embodiment, in case that the conductive particles COB are seated on the pad electrodes PAR1 and PAR2, the grooves GRO may provide the space in which the conductive particles COB can be seated, so that the conductive particles COB can be guided. Accordingly, the conductive particles COB are disposed on the grooves GRO formed in the pad electrodes PAR1 and PAR2, so that conductive particles COB are equally spaced apart from one another and are not agglomerated.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. A display device comprising:
- a wiring pad and a dummy pad disposed on a substrate and spaced apart from each other;
- a planarization layer disposed over the wiring pad and the dummy pad;
- a first insulating layer disposed on the planarization layer, the first insulating layer exposing a portion of the planarization layer;
- a first pad electrode and a second pad electrode disposed on the planarization layer and the first insulating layer, the first pad electrode electrically connected to the wiring pad and the second pad electrode electrically connected to the dummy pad;
- a second insulating layer disposed on the first pad electrode and the second pad electrode;
- conductive particles disposed on the first pad electrode and the second pad electrode, the conductive particles having a cylindrical shape; and
- an external device disposed on the conductive particles, wherein each of the conductive particles comprises:
- a conductive layer; and
- a capping layer surrounding the conductive layer, and the conductive layer has a cylindrical shape.

2. The display device of claim 1, wherein a side surface of the cylindrical shape of each of the conductive particles electrically contacts the first pad electrode and the second pad electrode.

3. The display device of claim 1, wherein
the external device comprises circuit lines disposed on a surface and the circuit lines
electrically contact the conductive particles.

4. The display device of claim 3, further comprising:
a non-conductive layer disposed between the external device and the substrate, wherein
the conductive particles are dispersed in the non-conductive layer.

5. The display device of claim 1, wherein the planarization layer comprises:
a first through hole exposing the wiring pad and a second through hole exposing the dummy pad,
the first pad electrode electrically contacts the wiring pad through the first through hole, and
the second pad electrode electrically contacts the dummy pad through the second through hole of the planarization layer.

6. The display device of claim 5, wherein the first insulating layer comprises a first opening exposing the first through hole and the second through hole of the planarization layer.

7. The display device of claim 1, wherein
the second insulating layer comprises a second opening exposing the first pad electrode and the second pad electrode, and
the conductive particles electrically contact the first pad electrode and the second pad electrode through the second opening of the second insulating layer.

8. The display device of claim 1, wherein the wiring pad and the dummy pad are spaced apart from each other in a first direction, extended in a second direction intersecting the first direction, and disposed on a same layer.

9. The display device of claim 8, wherein a width of the wiring pad in the first direction is greater than a width of the dummy pad in the first direction.

10. The display device of claim 1, further comprising:
light-emitting elements disposed on the first insulating layer, the light-emitting elements and the first insulating layer being spaced apart from the wiring pad and the dummy pad; and
a first connection electrode electrically contacting first ends of the light-emitting elements and a second connection electrode electrically contacting second ends of the light-emitting elements,
wherein the first pad electrode, the second pad electrode, the first connection electrode, and the second connection electrode comprise a same material.

11. A display device comprising:
a wiring pad and a dummy pad disposed on a substrate and spaced apart from each other;
a planarization layer disposed over the wiring pad and the dummy pad;
a first insulating layer disposed on the planarization layer, the first insulating layer exposing a portion of the planarization layer;
a first pad electrode and a second pad electrode disposed on the planarization layer and the first insulating layer, the first pad electrode electrically connected to the wiring pad and the second pad electrode electrically connected to the dummy pad;
a second insulating layer disposed on the first pad electrode and the second pad electrode;
conductive particles disposed on the first pad electrode and the second pad electrode, the conductive particles having a cylindrical shape; and
an external device disposed on the conductive particles, wherein:
the first pad electrode comprises first grooves formed in an upper surface,
the second pad electrode comprises second grooves formed in an upper surface, and
the first grooves and the second grooves face each other.

12. The display device of claim 11, wherein the first grooves are opened toward the second grooves, and the second grooves are opened toward the first grooves.

13. The display device of claim 11, wherein portions of first ends of the conductive particles are disposed in the first grooves, and portions of second ends of the conductive particles are disposed in the second grooves.

14. The display device of claim 11, wherein a depth of each of the first grooves and the second grooves is smaller than a diameter of the conductive particles.

* * * * *